United States Patent
Yuzurihara et al.

(10) Patent No.: US 10,038,435 B2
(45) Date of Patent: Jul. 31, 2018

(54) HIGH-FREQUENCY-ISOLATION GATE DRIVER CIRCUIT AND GATE CIRCUIT DRIVING METHOD

(71) Applicant: KYOSAN ELECTRIC MFG. CO., LTD., Yokohama-shi, Kanagawa (JP)

(72) Inventors: Itsuo Yuzurihara, Yokohama (JP); Hiroshi Kunitama, Yokohama (JP)

(73) Assignee: KYOSAN ELECTRIC MFG. CO., LTD., Yokohama-shi (JP)

( * ) Notice: Subject to any disclaimer, the term of this patent is extended or adjusted under 35 U.S.C. 154(b) by 0 days.

(21) Appl. No.: 15/528,858

(22) PCT Filed: Feb. 20, 2015

(86) PCT No.: PCT/JP2015/054726
§ 371 (c)(1),
(2) Date: May 23, 2017

(87) PCT Pub. No.: WO2016/121131
PCT Pub. Date: Aug. 4, 2016

(65) Prior Publication Data
US 2017/0331471 A1 Nov. 16, 2017

(30) Foreign Application Priority Data
Jan. 30, 2015 (JP) .................. 2015-016741

(51) Int. Cl.
*H03K 3/00* (2006.01)
*H03K 17/16* (2006.01)
*H03K 7/08* (2006.01)
(52) U.S. Cl.
CPC ............. *H03K 17/162* (2013.01); *H03K 7/08* (2013.01)
(58) Field of Classification Search
None
See application file for complete search history.

(56) References Cited

U.S. PATENT DOCUMENTS

| 5,912,810 A | 6/1999 | Jacobs et al. | |
|---|---|---|---|
| 2004/0032212 A1* | 2/2004 | Yuzurihara | H01J 37/32082 315/111.81 |

(Continued)

FOREIGN PATENT DOCUMENTS

| CN | 103683866 A | 3/2014 |
|---|---|---|
| EP | 2 712 082 A1 | 3/2014 |

(Continued)

OTHER PUBLICATIONS

International Search Report dated May 19, 2015, issued in counterpart International Application No. PCT/JP2015/054726 (2 pages).

(Continued)

*Primary Examiner* — Long Nguyen
(74) *Attorney, Agent, or Firm* — Westerman, Hattori, Daniels & Adrian, LLP

(57) ABSTRACT

In a configuration of an isolation circuit using a transformer of a high-frequency-isolation gate driver circuit in the frequency band from 1 to 100 MHz, a period for resetting the exciting current is eliminated, generation of self-resonance phenomenon after resetting is cancelled to reduce generation of noise current, and malfunctions of the switching element due to noise is prevented. In driving plural gate circuits by RF signals, exciting current is allowed to pass through a primary coil of a gate driver transformer alternately in both directions continuously all the time, in a configuration for isolating drive input signals by the gate driver transformer. Accordingly, the reset period that is required when the exciting current flows only in one way becomes unnecessary, and thus generation of self-resonance phenomenon after resetting is canceled. Then, generation of noise current caused by the self-resonance phenomenon is reduced.

17 Claims, 13 Drawing Sheets

(56) References Cited

U.S. PATENT DOCUMENTS

2006/0279969 A1* 12/2006 Leung ............... H02M 3/33515
  363/41
2010/0232180 A1* 9/2010 Sase ................. H02M 3/33576
  363/17

FOREIGN PATENT DOCUMENTS

| JP | 2-53279 | U1 | 4/1990 | | |
| JP | 2-75823 | U1 | 6/1990 | | |
| JP | 3-82362 | A | 4/1991 | | |
| JP | 4-114232 | U | 10/1992 | | |
| JP | 4-114232 | U1 | 10/1992 | | |
| JP | 4-128435 | U | 11/1992 | | |
| JP | 4-128435 | U1 | 11/1992 | | |
| JP | 6-2994 | U | 1/1994 | | |
| JP | 2002-64339 | A | 2/2002 | | |
| JP | 2004-153882 | A | 5/2004 | | |
| JP | 2004-153882 | A | * 5/2004 | ........... | H03K 17/687 |
| JP | 2008-270548 | A | 11/2008 | | |
| JP | 2009-278863 | A | 11/2009 | | |
| JP | 2011-244615 | A | 12/2011 | | |
| JP | 5416673 | B2 | 2/2014 | | |
| JP | 2014-200133 | A | 10/2014 | | |
| TW | I294716 | B1 | 3/2008 | | |
| WO | 2013/046420 | A1 | 4/2013 | | |

OTHER PUBLICATIONS

Written Opinion of the International Searching Authority dated May 19, 2015, issued in counterpart International Application No. PCT/JP2015/054726, with English translation (14 pages).
Office Action dated Dec. 10, 2015, issued in Japanese application No. 2015-016741, with English translation (14 pages).
Notification of Transmittal of Copies of Translation of the International Preliminary Report on Patentability (Form PCT/IB/338) issued in counterpart International Application No. PCT/JP2015/054726 dated Aug. 10, 2017, with (Form PCT/IB/373) and (Form PCT/ISA/237). (11 pages).
Taiwan IPO Search Report dated May 12, 2017, issued in counterpart Taiwanese Patent Application No. 104119273, with English translation. (3 pages).
Office Action dated Dec. 19, 2017, issued in counterpart Chinese Application No. 201580074222.0, with English translation. (9 pages).
Decision to Grant a Patent dated Apr. 26, 2018, issued in counterpart Korean Application No. 10-2017-7021906, with English translation. (2 pages).

* cited by examiner

CIRCUIT USING CONSTRAINED
MAGNETIZATION GATE TRANSFORMER

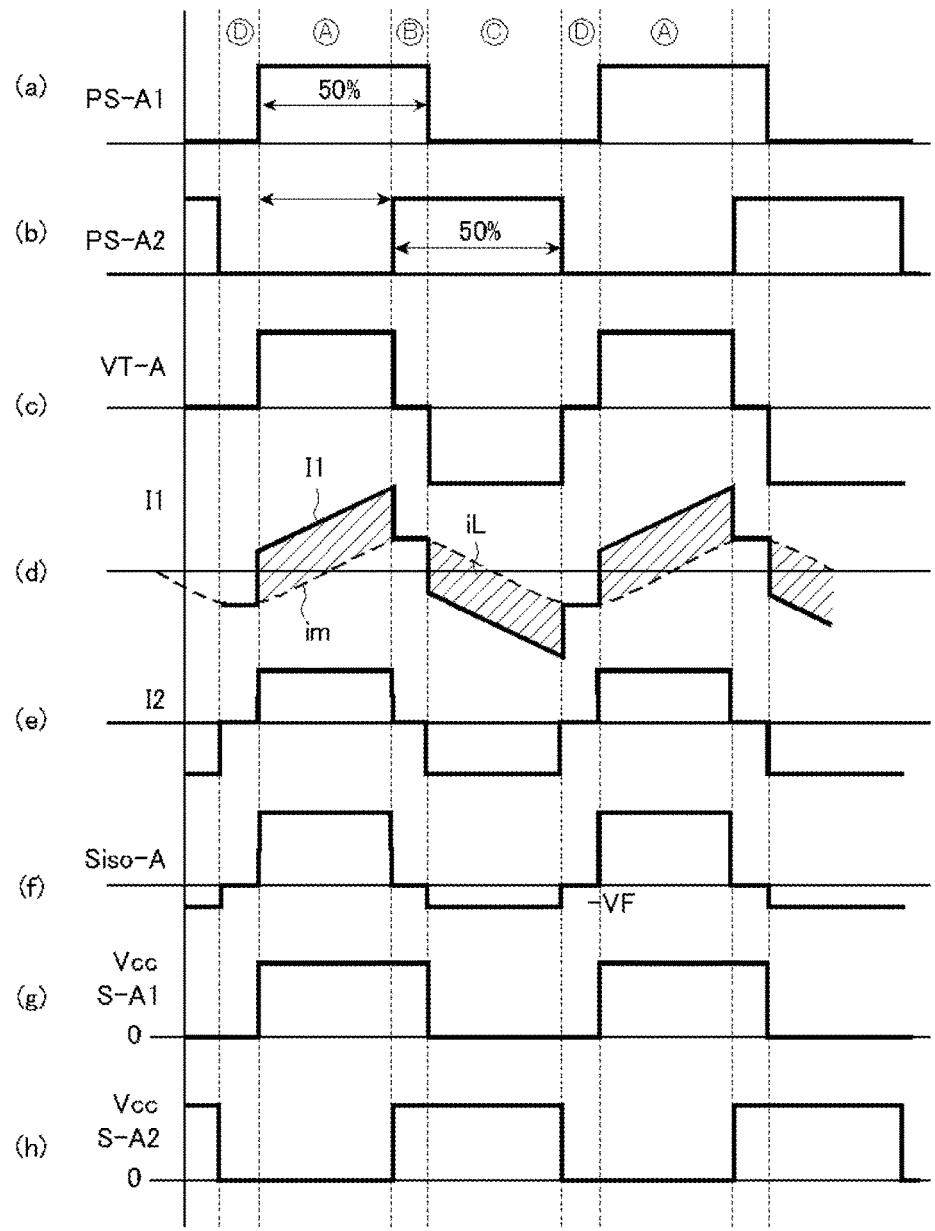

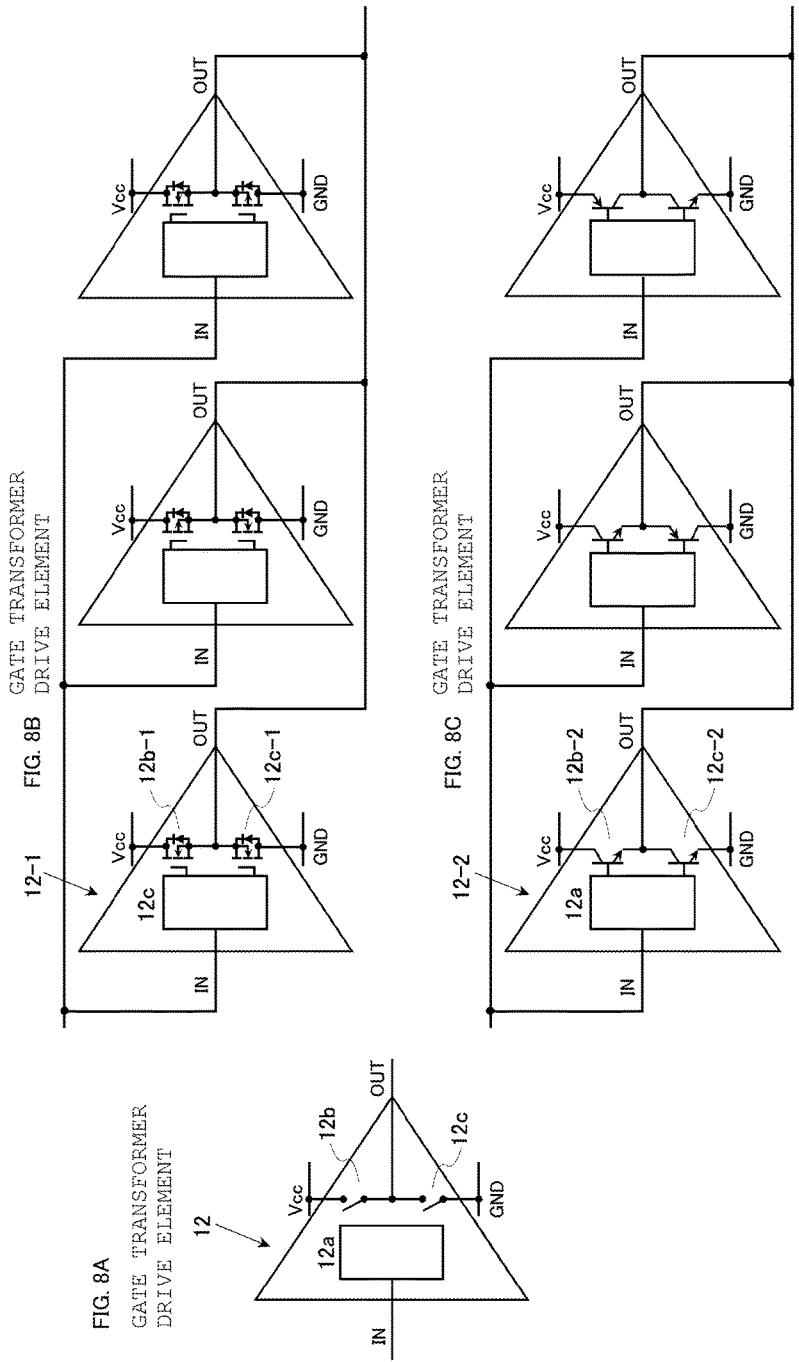

FIG. 9A                                                          PRIOR ART
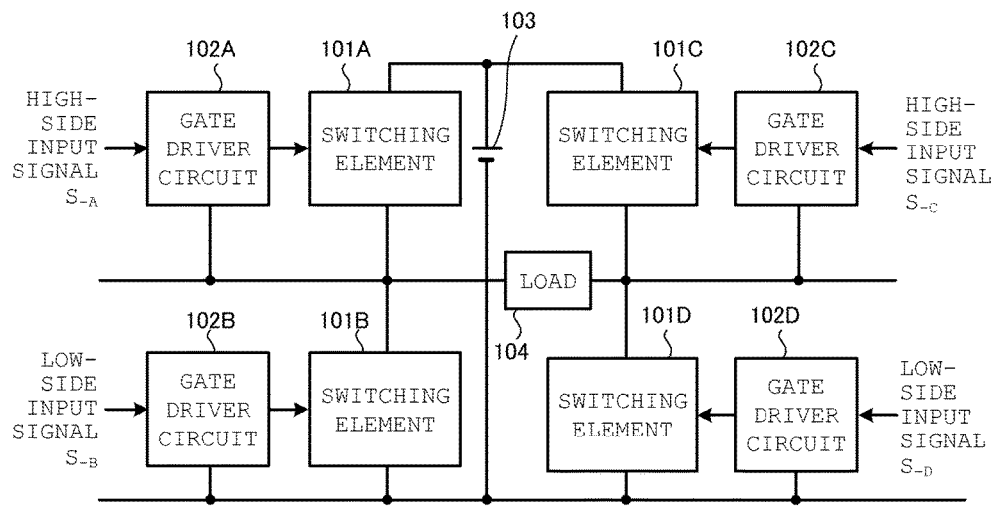
FIG. 9B                                                          PRIOR ART
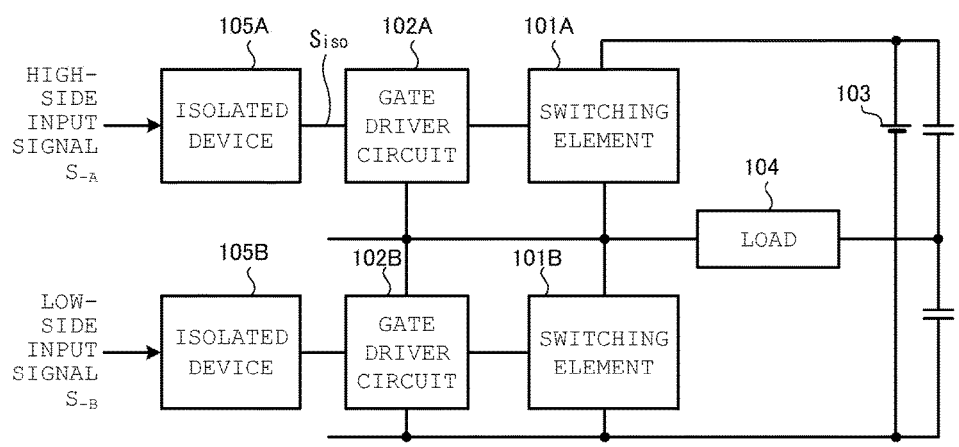

CIRCUIT USING OPTICAL ISOLATION DEVICE
OPTICAL DRIVE CIRCUIT
PRIOR ART

CIRCUIT USING OPTICAL ISOLATION DEVICE
DRIVE SIGNAL WAVEFORMS
PRIOR ART

PRIOR ART
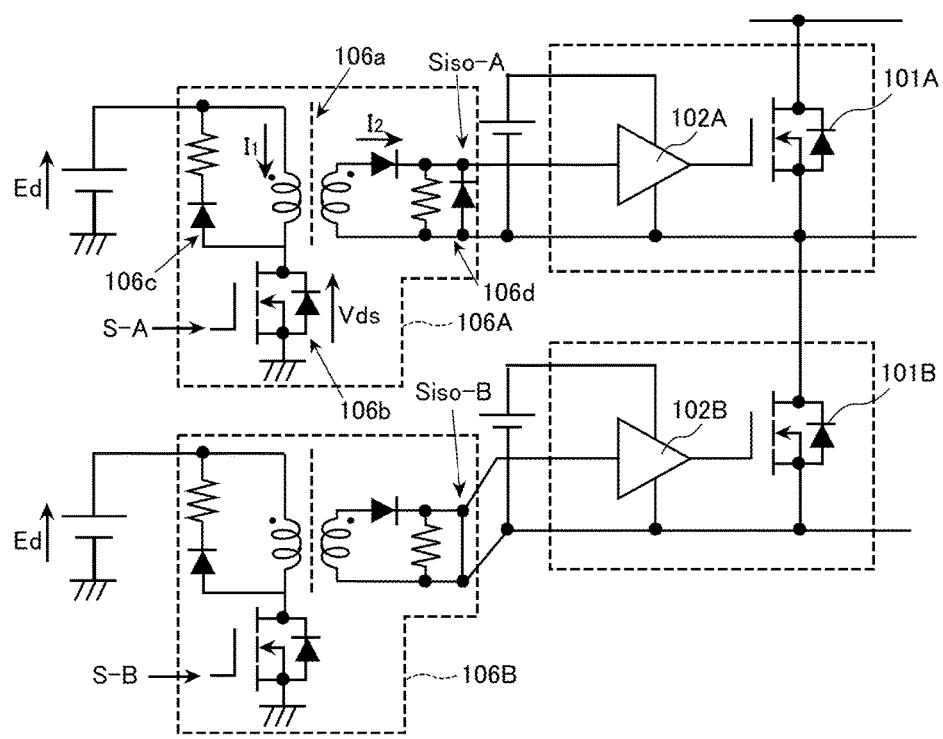
FIG. 11A DRIVE CIRCUIT
CIRCUIT USING FREE MAGNETIZATION TRANSFORMER

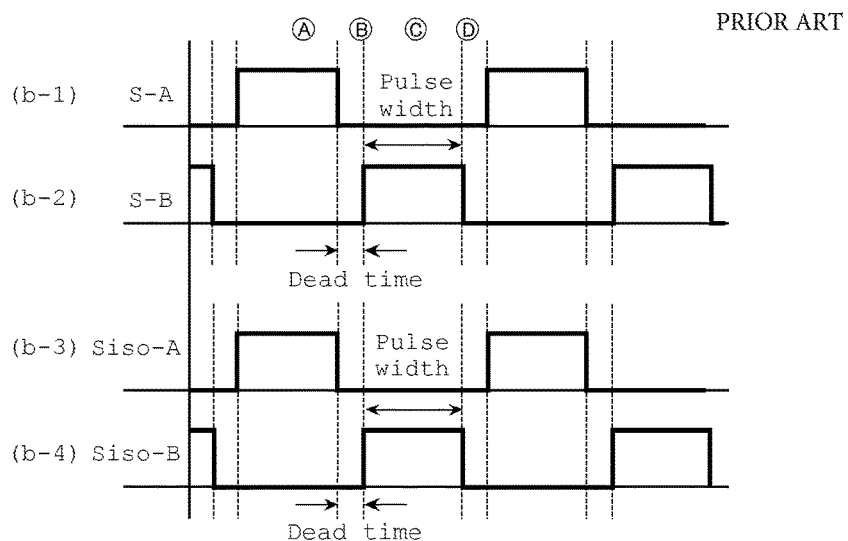
FIG. 11B DRIVE SIGNAL WAVEFORMS
CIRCUIT USING FREE MAGNETIZATION TRANSFORMER
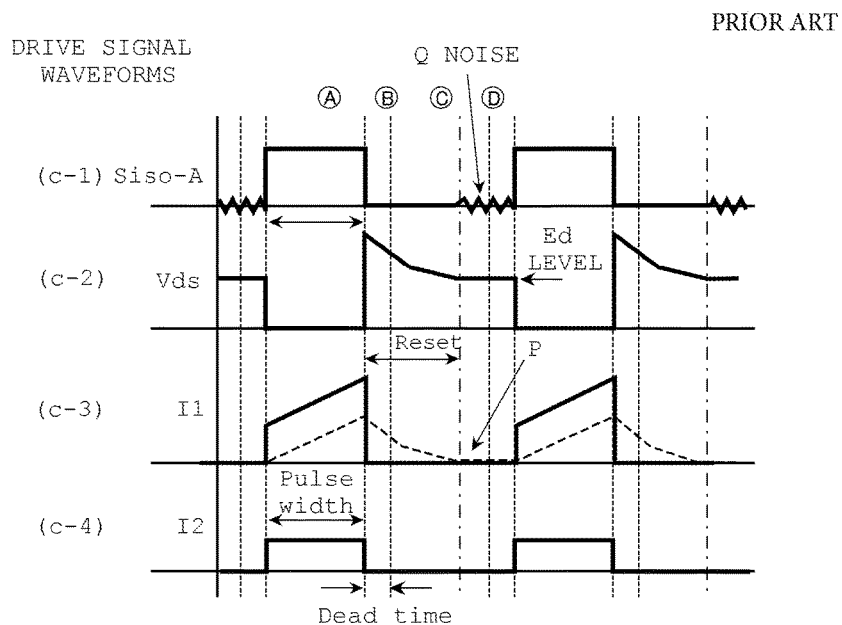
FIG. 11C DRIVE SIGNAL WAVEFORMS
CIRCUIT USING FREE MAGNETIZATION TRANSFORMER

HIGH-FREQUENCY-ISOLATION GATE DRIVER CIRCUIT AND GATE CIRCUIT DRIVING METHOD

TECHNICAL FIELD

The present invention relates to a gate driver circuit for driving a gate circuit of a semiconductor switching element and a gate circuit driving method, and it is applied to a high-frequency amplifier that delivers high-frequency power at frequencies from 1 MHz to 100 MHz.

BACKGROUND ART

In a power converter such as an inverter, a gate circuit of a switching element for driving a load is connected in series with a main electric power source, and a current direction of the load is switched by a bridge circuit, for example.

FIG. 9A shows a configuration example of the power converter. This figure illustrates an example that a full bridge of switching elements 101A to 101D for switching connection between a driving source 103 and a load 104.

The switching elements 101A to 101D are controlled on and off, respectively by the gate driver circuits 102A to 102D.

The gate driver circuit 102A and the gate driver circuit 102C control on and off of the switching element 101A and the switching element 101C, according to high-side input signals S-A and S-C, and the gate driver circuit 102B and the gate driver circuit 102D control on and off of the switching element 101B and the switching element 101D, according to low-side input signals S-B and S-D, whereby a current direction toward the load 104 is switched.

In this gate driver circuit, according to the on/off state on both the high side and the low side, the potential of the high-side switching elements 101A and 101C is liable to floating, causing fluctuations of reference potential, though there is no fluctuation of the reference potential in the low-side switching elements 101B and 101D. Therefore, there is a difference between the high-side reference potential and the low-side reference potential, and this may cause a short circuit.

In order to avoid this short circuit, it is necessary to render the reference potential of the high-side and low-side switching elements as floating potential. The input signals S-A to S-D to the gate driver circuits 102A to 102D for controlling on/off of the switching elements 101A to 101D, respectively, are required to be isolated electrically, so as to render the reference potential of the switching elements as floating.

FIG. 9B shows a configuration example of a power converter that employs isolation devices. In this example, a half bridge of the switching elements 101A and 101B switches the connection between the driving source 103 and the load 104.

On the input side of the gate driver circuits 102A and 102B, the isolation devices 105A and 105B are connected respectively, and the isolation devices 105A and 105B provide electrical isolation between the input signals S-A and S-B and isolated drive signals Siso. There are known a photo coupler or a pulse transformer, as the isolation device for electrically isolating input signals in the gate driver circuit (Patent documents 1 and 2).

The pulse transformer is used as a transformer for driving the gate circuit, and it is also referred to as a gate-driver transformer.

FIGS. 10A and 10B show an example of a circuit that employs the photo coupler. In the drive circuit as shown in FIG. 10A, gate driver circuits 102A and 102B for driving the switching elements 101A and 101B, respectively, are connected to the photo couplers 105A and 105B, whereby isolation is provided between the input signal S-A and the isolated drive signal Siso-A, and between the input signal S-B and the isolated drive signal Siso-B.

It is to be noted that the switching element 101 such as an RF MOS-FET may be combined with the gate driver circuit 102 such as an FET driver, so as to constitute an RF-MOS module which is built in the driver.

FIG. 10B illustrates drive signal waveforms. The reference numeral (b-1) indicates the high-side input signal S-A, the reference numeral (b-3) indicates the high-side isolated drive signal Siso-A, which is obtained by the isolation according to the photo coupler. The reference numeral (b-2) indicates the low-side input signal S-B, and the reference numeral (b-4) indicates the low-side isolated drive signal Siso-B, which is obtained by the isolation according to the photo coupler.

FIGS. 11A through 11C show a circuit example that provides isolation by using a gate-driver transformer (pulse transformer). In the drive circuit as shown in FIG. 11A, a free-magnetization transformer circuits 106A and 106B are connected respectively to the gate driver circuits 102A and 102B for driving the switching elements 101A and 101B, so as to provide isolation between the input signal S-A and the isolated drive signal Siso-A, and between the input signal S-B and the isolated drive signal Siso-B. Also in the circuit example as shown in FIG. 11A, similar to the circuit example as shown in FIG. 10A, the switching elements 101A and 101B such as RF MOS-FETs may be combined, respectively with the gate driver circuits 102A and 102B such as FET drivers, so as to constitute RF-MOS modules built in the driver.

The free-magnetization transformer circuits 106A and 106B as shown in FIGS. 11A through 11C are isolation circuits, each made up of a forward-type gate-driver transformer (pulse transformer), and an FET 106b is connected in series with the primary coil of the gate-driver transformer (pulse transformer) 106a. Furthermore, a series circuit of a rectifier diode and resistance is connected to the primary coil in parallel, and a rectifier circuit 106d is connected to the output end of the secondary coil side.

In the free-magnetization transformer circuit 106, the transformer is excited only in one way, and energy accumulated in the coils is released during a period when the switching element is OFF, thereby resetting the magnetized state. The series circuit of the rectifier diode and the resistance, being connected in parallel with the primary coil, constitutes a reset circuit (snubber circuit) 106c.

In the example here, resetting of the magnetized state of the coils that have been magnetized is performed, by spontaneously releasing the energy accumulated in the coils. Resetting of the magnetization of the coils is performed spontaneously without external actions, and therefore it is referred to as "free magnetization".

FIG. 11B shows drive signal waveforms. The reference numeral (b-1) indicates the high-side input signal S-A, and the reference numeral (b-2) indicates the low-side input signal S-B. The reference numeral (b-3) indicates the high-side isolated drive signal Siso-A, which is obtained by isolation by the gate-driver transformer, and the reference numeral (b-4) indicates the low-side isolated drive signal Siso-B, which is obtained by isolation by the gate-driver transformer.

PRIOR ART DOCUMENT

Patent Document

Patent Document 1
Japanese Patent No. 5416673
Patent Document 2
Japanese Unexamined Patent Application Publication No. 2008-270548

DISCLOSURE OF THE INVENTION

Problems to be Solved by the Invention

The circuit configuration employing the photo coupler as the isolation device has following problems:

1) A phase difference may occur between the signals before and after isolation, when the photo coupler is employed.

As shown in comparison between the input signal S-A in FIG. 10B(b-1) and the isolated drive signal Siso-A in FIG. 10B(b-3), a delay occurs due to a transmission delay of the photo coupler itself, and a phase difference is generated in the isolated drive signal Siso-A after the isolation, relative to the input signal S-A before the isolation.

2) A pulse width of the isolated drive signal varies after isolation, when the photo coupler is employed.

As shown in comparison between the input signal S-B in FIG. 10B(b-2) and the isolated drive signal Siso-B in FIG. 10B(b-4), the pulse width of the isolated drive signal Siso-B after the isolation is increased or decreased relative to the input signal S-B before the isolation, due to variation of thresholds within the photo coupler.

Because of the problems 1) and 2), if the photo coupler is employed for isolating high-frequency gate signals, it is necessary to make any corrections on the isolated drive signals after the isolation. If the transformer constitutes the load without correcting the drive signals after the isolation, there is a problem of biased magnetization in the transformer, since a difference may occur between positive and negative voltage-time products being applied.

3) When the photo coupler is employed, there is a problem that operational variation of the photo coupler may cause a short-circuit between the high-side switching element and the low-side switching element.

If there is operational variation of the photo coupler, a dead time between the high-side isolated drive signal Siso-A and the low-side isolated drive signal Siso-B may become short as indicated by Td-2, and a high/low short-circuit may be established between the RF-MOSFETs of the switching element 101A and the switching element 101B.

4) There is a problem that the photo coupler is susceptible to noise in practice, since output current on the isolator side is small, e.g., a few tens of μA to a few mA.

5) There is a problem that the photo coupler may be initiated erroneously, due to high-frequency displacement voltage which comes out through parasitic capacitance Ciso between the photo coupler isolators.

On the other hand, isolation by using the free-magnetization transformer has an advantage of higher noise resistance relative to the photo coupler, since the phase difference and pulse width displacement between the input signal and the isolated drive signal can be cancelled, as far as the MOS-FET 106b for driving the transformer has the same characteristics, and a large amount of secondary current I2 can be allowed to pass from the transformer, depending on the performance of the MOS-FET 106b for driving the transformer.

However, there are following problems, when the free-magnetization transformer is employed. FIG. 11C shows drive signal waveforms after isolation.

6) As shown in FIG. 11 C(c-3), in order to reset the exciting current (indicated by the broken line and shaded area in I1), the RESET period is necessary, and there is a problem that during this RESET period, surge voltage may be generated in the voltage Vds across the MOS-FET 106b.

7) There is also a problem that due to the RESET period, if a duty ratio of the input signal S-A and the input signal S-B as shown in FIG. 11B(b-1) and (b-2) becomes high and the pulse width grows excessively large, the exciting current cannot be reset sufficiently and magnetization may be biased in the transformer. If magnetization is biased in the transformer, the MOS-FET of the gate driver circuit may be damaged.

8) As indicated by the reference symbol P in FIG. 11C (c-3), after the exciting current is reset, the current I1 in the primary coil is lost. Therefore, a self-resonant phenomenon caused by leakage inductance and leakage stray capacity of the coil, after the RESET period, may induce a noise component Q to be included in the isolated drive signal Siso after isolation, and this is considered as a drawback. Thus, there is a possibility that the noise component Q in the isolated drive signal Siso may cause a short-circuit between the high-side switching element 101A and the low-side switching element 101B.

9) It is necessary to improve withstand voltage of the MOS-FET 106b, since surge voltage generated in voltage Vds across the MOS-FET 106b raises voltage between DS of MOSFET for driving the transformer 106b. In general, an MOS-FET having high withstand voltage is likely to be slow in switching speed, and therefore, there is a possibility that a driving speed of the RF-MOS module may be constrained by the speed of the MOS-FET for driving the transformer.

Therefore, in the configuration using the free-magnetization transformer, there are problems as the followings; the reset period is required and excessive voltage is generated due to the self-resonance phenomenon at the end of resetting, and accordingly, malfunctions are likely to occur, such as turning on the RF-MOS of the switching element again. This tendency is more pronounced as the frequency becomes higher.

An object of the present invention is to solve the conventional problems as described above, and to eliminate the period for resetting the exciting current in the configuration of the isolation circuit using the transformer, thereby canceling generation of the self-resonance phenomenon after resetting. Another object of the present invention is to reduce generation of noise current caused by the self-resonance phenomenon, so as to prevent malfunctions of the switching element due to the noise.

Means for Solving the Problems

The present invention is directed to a configuration for isolating drive input signals in a gate-driver transformer, when plural gate circuits are driven by RF signals, where exciting current passing through a primary coil of the gate-driver transformer is made to flow continuously in both directions in an alternate manner all the time, thereby eliminating a reset period that is required when the exciting current flows only in one direction, and cancelling a self-resonance phenomenon that is generated after resetting.

Since generation of the self-resonance phenomenon is eliminated, generation of noise current due to the self-resonance phenomenon can be reduced, thus preventing malfunctions of a switching element due to the noise current.

The present invention includes an aspect of an apparatus and an aspect of a method. The present invention will be described in the following with the use of the reference symbols as shown in FIGS. 1A and 1B to FIG. 3.

[Aspect of Apparatus]

In the aspect of the apparatus, a high-frequency-isolation gate driver circuit of the present invention drives plural gate circuits according to RF signals mutually isolated.

The high-frequency-isolation gate driver circuit is provided with an input signal formation circuit, a gate-driver transformer, and a current-voltage conversion circuit.

(Input Signal Formation Circuit)

The input signal formation circuit delivers two input signals (S) being complementary voltage signals with the same duty ratio but with a relative phase shift. The two input signals are provided with a complementary potential period when the voltages of both phases have a complementary relation, i.e., one having high potential and the other having low potential; and an equipotential period when the voltages of both phases have equal potential. The potential of each of the two input signals is switched between high potential and low potential alternately in a time sequence.

One configuration of the input signal formation circuit is provided with a pulse signal formation circuit (11) for forming an RF pulse signal (PS), and two gate-driver transformer drive elements (12) for delivering input signals (S) each having high potential or low potential, based on the RF pulse signal being binary.

Another configuration of the input signal formation circuit is provided with a control circuit (13) for forming an RF pulse signal, and two gate-driver transformer drive elements (12) for delivering input signals (S) each having high potential or low potential, which is based on a binary signal of the RF pulse signal famed by the control circuit (13).

As one form of the high-potential input signal and low-potential input signal, the high-side gate-driver transformer drive element forms the high-potential input signal on the basis of power supply voltage, and the low-side gate-driver transformer drive element forms the low-potential input signal on the basis of ground voltage or reference voltage including zero voltage. In practice, a voltage drop is likely to occur within the gate-driver transformer drive element, and thus voltage obtained by deducting the voltage drop component is formed as the input signal.

As another form of the high-potential input signal and low-potential input signal, the high-side gate-driver transformer drive element forms the high-potential input signal on the basis of positive power supply voltage, and the low-side gate-driver transformer drive element forms the low-potential input signal on the basis of negative power supply voltage.

(Gate-Driver Transformer)

In a gate-driver transformer (20), output terminals for respective phases of the input signal formation circuit are connected with input terminals of both ends of the primary coil. The input signal (S) enters the gate-driver transformer, and a signal being isolated from this input signal is formed.

Two input signals (S) applied respectively to both ends of the primary coil in the gate-driver transformer of the present invention are provided with a complementary potential period when the voltages of both phases have a complementary relation with each other, i.e., one having high potential and the other having low potential, and an equipotential period when the voltages of both phases have equal potential. Exciting current (im) and load current (iL) are made to pass through the primary coil of the gate-driver transformer (20) during the complementary potential period, whereas during the equipotential period, only the exciting current (im) is made to pass therethrough. Accordingly, the exciting current (im) passes through the primary coil all the time throughout the periods.

As for the exciting current (im), the state of high potential and the state of low potential are replaced with each other in a time sequence in the complementary potential period, thereby reversing the current direction in the primary coil. Therefore, it is possible to eliminate the reset period for resetting the exciting current.

In addition, since the exciting current passes through the primary coil during the equipotential period, it is possible to reduce occurrence of noise current due to a self resonance phenomenon.

In the gate-driver transformer of the present invention provided in the high-frequency-isolation gate driver circuit of the present invention, exciting current (im) passes through the primary coil throughout the periods, and thus the coil is kept magnetized all the time. In the free-magnetization transformer used in a conventional isolation circuit, there is a certain period when the exciting current does not flow after the exciting current is reset. During this period, the magnetic flux condition of the coil is free, that is, not controlled by the gate-driver transformer circuit, and during this period, noise current may occur due to a self resonance phenomenon. On the other hand, in the gate-driver transformer of the present invention, the gate-driver transformer circuit makes the exciting current pass through the primary coil all the time, and therefore the magnetic flux condition of the coil becomes controlled, that is, constrained by the gate-driver transformer circuit. In here, the gate-driver transformer provided in the present invention is referred to as a constrained magnetization transformer, as opposed to the conventional free-magnetization transformer.

(Current-Voltage Conversion Circuit)

Output terminals of the gate-driver transformer (20) are connected to input terminals of the current-voltage conversion circuit (30), so as to provide current/voltage conversion to secondary current passing through the gate-driver transformer, and to deliver an isolated drive signal (Siso) obtained by the conversion, to the gate circuit.

The current-voltage conversion circuit (30) of the present invention may comprise a series connection of a first parallel circuit and a parallel connection of a second parallel circuit, each including a resistance and a rectifier diode connected in parallel.

The first parallel circuit is connected in series with the secondary coil of the gate-driver transformer at its winding start, in such a manner that a forward direction of the rectifier diode is oriented to the gate circuit. On the other hand, the second parallel circuit is connected in parallel with the secondary coil of the gate-driver transformer, between the winding start and the winding end, in such a manner that the forward direction of the rectifier diode is oriented to the input end of the gate circuit.

The current-voltage conversion circuit of the present invention converts the current passing through the secondary coil of the gate-driver transformer into voltage, according to current-voltage conversion by the series-connected resistance in the first parallel circuit, and a parallel-connected resistance in the second parallel circuit, and rectifying actions of the rectifier diode connected in parallel with each resistance can perform rectification in the current direction oriented to the gate driver circuit side. The first parallel circuit and/or the second parallel circuit may be configured as a configuration that connects a capacitor in parallel.

There are plural modes of the current-voltage conversion circuit of the present invention.

In a first mode of the current-voltage conversion circuit, a value of the resistance in the first parallel circuit and a value of the resistance in the second parallel circuit adjust input impedance, viewed from the gate-driver transformer, to a predetermined value. By setting the value of the resistance in the first parallel circuit to be equivalent to the value of resistance in the second parallel circuit, it is possible to obtain an impedance being constant all the time, when viewing the output side from the gate-driver transformer side. It should be noted that the resistant value being equivalent is not limited to an identical value, but includes an allowable component.

In a second mode of the current-voltage conversion circuit, a value of the resistance in the first parallel circuit and a value of the resistance in the second parallel circuit are selected in such a manner that they become identical to a characteristic impedance of a transmission path between the gate-driver transformer and the current-voltage conversion circuit. According to the second mode, an input signal into the primary side of the gate-driver transformer can be transmitted to the gate driver circuit as an isolated drive signal, without distortion.

In a third mode of the current-voltage conversion circuit, a common-mode transformer is provided on the primary side or the secondary side of the gate-driver transformer, and a characteristic impedance of the common-mode transformer is made identical to the characteristic impedance of the transmission path between the gate-driver transformer and the current-voltage conversion circuit. According to the third mode, the common mode transformer may block common-mode noise current that passes in the same direction through the parasitic capacitance between the primary coil and the secondary coil of the gate-driver transformer, and reduce influence of the displacement voltage.

(Aspect of Circuit Configuration)

In the gate circuit of the present invention, a high-frequency switching module may be made up of a switching element and a gate driver circuit for driving the switching element.

The gate driver circuit performs on/off control of the switching element, according to isolated drive signal (Siso) outputted from the current-voltage conversion circuit. The high-frequency switching module may be used as the basic unit for the on/off control.

The high-frequency-isolation gate driver circuit of the present invention may comprise a full bridge or a half bridge. The basic unit for constituting the bridge may be the gate circuit, or the high-frequency switching module.

In the case where the gate circuit is used as a constituent unit of the bridge, the high-frequency-isolation gate driver circuits are connected, respectively, to the input end of a high-voltage gate circuit for applying high voltage to the load and to the input end of a low-voltage gate circuit for applying low voltage to the load.

In the case where the high-frequency switching module is used as the constituent unit of the bridge, the current-voltage conversion circuits are connected, respectively, to the input end of the high-frequency switching module on the high side and to the input end of the high-frequency switching module on the low side.

[Aspect of Method]

The gate circuit driving method of the present invention is a method for driving plural gate circuits, by plural isolated RF signals, and two input signals (S) are applied respectively to both ends of the primary coil of the gate-driver transformer (20), the two input signals being complementary voltage signals with the same duty ratio but with a relative phase shift, provided with a complementary potential period when the voltages of both phases have a complementary relation with each other, i.e., one having high potential and the other having low potential; and an equipotential period when the voltages of both phases have equal potential, the potential of each of the two input signals being switched, between high potential and low potential alternately in a time sequence, and exciting current and load current are allowed to pass during the complementary potential period, and the exciting current is allowed to pass during the equipotential period, thereby inputting an isolated drive signal (Siso) into the gate circuit, obtained by a current-voltage conversion for converting the secondary current passing through the secondary coil of the gate-driver transformer (20), and driving the gate circuits by the isolated drive signal (Siso).

According to the gate circuit driving method of the present invention, two input signals (S) applied respectively to both ends of the primary coil in the gate-driver transformer are provided with a complementary potential period when voltages of both phases have a complementary relation with each other, i.e., one having high potential and the other having low potential, and an equipotential period when the voltages of both phases have equal potential. Then, exciting current (im) and load current (iL) pass through the primary coil of the gate-driver transformer (20) during the complementary potential period, whereas during the equipotential period, only the exciting current (im) passes therethrough, and accordingly, the exciting current (im) passes through the primary coil all the time throughout the periods.

As for the exciting current (im), the state of high potential and the state of low potential are replaced with each other in a time sequence in the complementary potential period, thereby reversing the current direction in the primary coil. Therefore, it is possible to eliminate the reset period for resetting the exciting current. In addition, since the exciting current passes through the primary coil during the equipotential period, it is possible to reduce occurrence of noise current due to a self resonance phenomenon.

In the gate circuit driving method of the present invention, the current-voltage conversion circuit (30) connected to the secondary coil of the gate-driver transformer (20) performs current-voltage conversion.

The current-voltage conversion circuit may comprise a series connection of a first parallel circuit and a parallel connection of a second parallel circuit, each including a resistance and a rectifier diode connected in parallel, and the current-voltage conversion circuit is connected to the secondary coil of the gate driver transformer (20). The first parallel circuit is a parallel-connection circuit of a resistance and a rectifier diode, and it is connected in series with the secondary coil of the gate-driver transformer at its winding start, in such a manner that a forward direction of the rectifier diode is oriented to the gate circuit. On the other hand, the second parallel circuit is a parallel-connection circuit of a resistance and a rectifier diode, and it is connected in parallel with the secondary coil of the gate-driver transformer, between the winding start and the winding end, in such a manner that the forward direction of the rectifier diode is oriented to the input end of the gate driver circuit.

During the period when difference voltage of the input signals (S) is negative with respect to the forward direction of the rectifier diode in the first parallel circuit, the potential of the isolated drive signal (Siso) is biased in the reverse direction only by a forward-direction voltage component, according to the rectifier diode of the second parallel circuit.

During the period when difference voltage of the input signals (S) is negative with respect to the forward direction of the rectifier diode of the first parallel circuit, the input side of the first parallel circuit becomes low potential and the output side of the first parallel circuit, being connected via the second parallel circuit, becomes high potential, and this corresponds to the negative voltage period when the negative voltage is applied to the current-voltage conversion circuit.

Even when a noise component is generated in the input signal and the isolated drive signal fluctuates, the input end voltage of the MOS-FET in the gate driver circuit is biased in the reverse direction by the forward-direction voltage component of the rectifier diode for the gate driver circuit and thus malfunctions are prevented, further preventing short-circuiting between the high-side switching element and the low-side switching element, caused by simultaneously turning on the RF-MOS of the switching element that is controlled on/off by the gate driver circuit.

In the gate circuit driving method of the present invention, two input signals are created by using two gate-driver transformer drive elements, and a binary RF pulse signal (PS) being a high-potential signal is applied to one of the gate-driver transformer drive elements, so as to create a high-potential input signal (S), and a binary RF signal (PS) being a low-potential signal is applied to the other gate-driver transformer drive element, so as to create a low-potential input signal (S).

According to the isolation and current-voltage conversion of the gate-driver transformer, the isolated drive signals (Siso) obtained from the input signals (S) are inputted into the gate driver circuit, thereby generating drive voltage in the gate driver circuit, and performing on/off control on the switching elements in the gate circuit, by thus generated drive voltage.

The duty ratio of the isolated drive signals can be adjusted by varying a phase difference between the two input signals (S). This duty ratio can be adjusted with maintaining low impedance throughout the entire period.

Advantages of the Invention

As described above, according to the present invention, in the isolation circuit using the gate-driver transformer, the period for resetting the exciting current can be eliminated, and occurrence of self resonance phenomenon after resetting can be prevented. In addition, a constant flow of exciting current prevents noise current occurrence due to the self resonance phenomenon, and malfunctions of the switching element can be reduced.

The high-frequency-isolation gate driver circuit and the gate circuit driving method of the present invention are suitable for high frequencies in the band from 1 to 100 MHz, which is difficult to cope with, by the photo coupler method or the free-magnetization transformer method, and they are adaptable to a high-frequency amplifier for outputting high-frequency power at frequencies from 1 MHz to 100 MHz.

BRIEF DESCRIPTION OF THE DRAWINGS

FIG. 3 illustrates the state of current and voltage in the high-frequency-isolation gate driver circuit of the present invention;

FIGS. 8A through 8C illustrate configuration examples of a gate-driver transformer drive element in the high-frequency-isolation gate driver circuit of the present invention;

FIGS. 9A and 9B illustrate configuration examples of a power converter;

FIGS. 11A through 11C illustrate a circuit example using gate-driver transformers (pulse transformers).

BEST MODE FOR CARRYING OUT THE INVENTION

A high-frequency-isolation gate driver circuit and a gate circuit driving method will now be described, with reference to FIGS. 1A and 1B to FIG. 7.

Figure 1A:
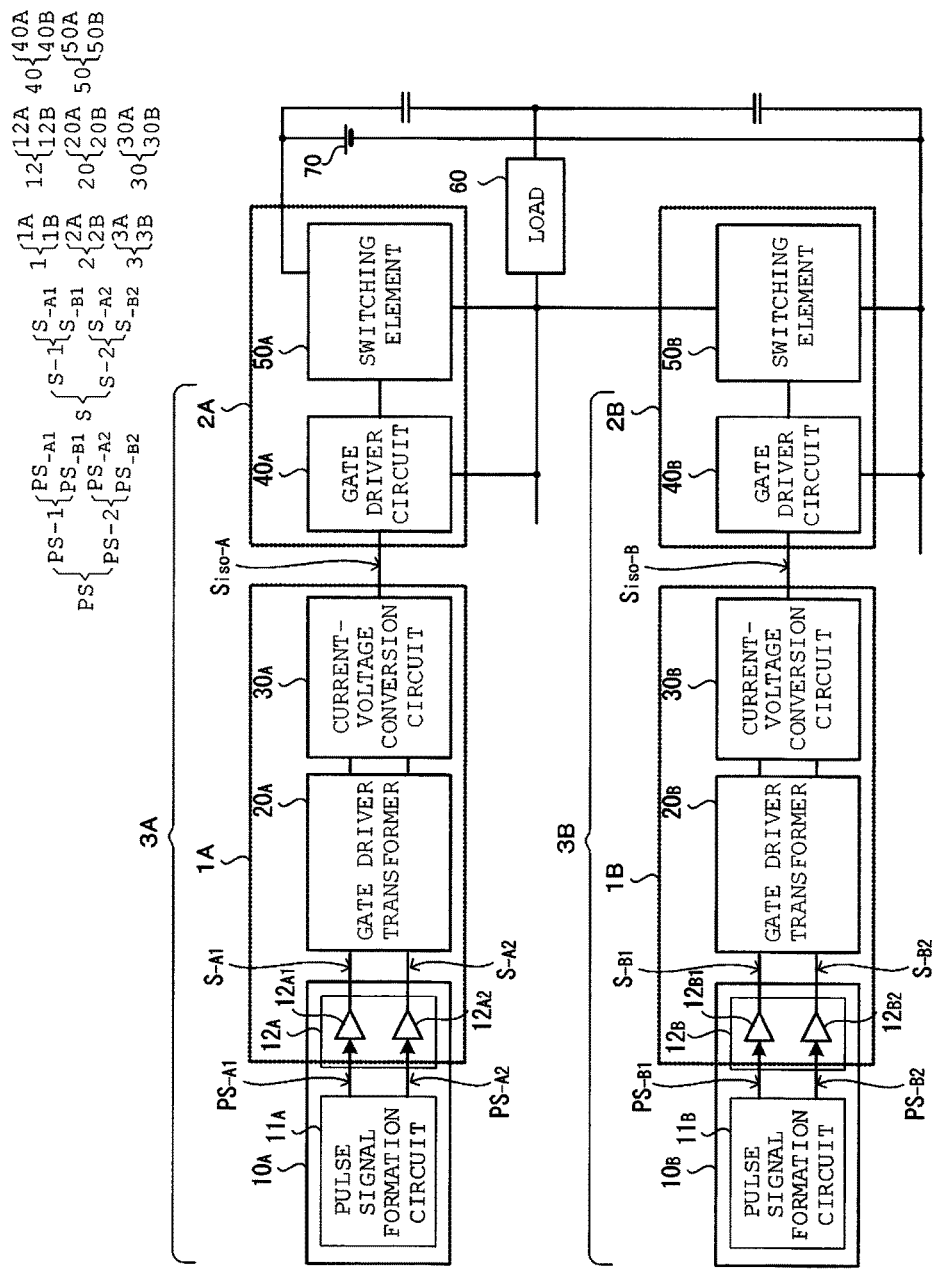
FIGS. 1A and 1B illustrate a schematic configuration of a high-frequency-isolation gate driver circuit of the present invention.
Figure 1B:
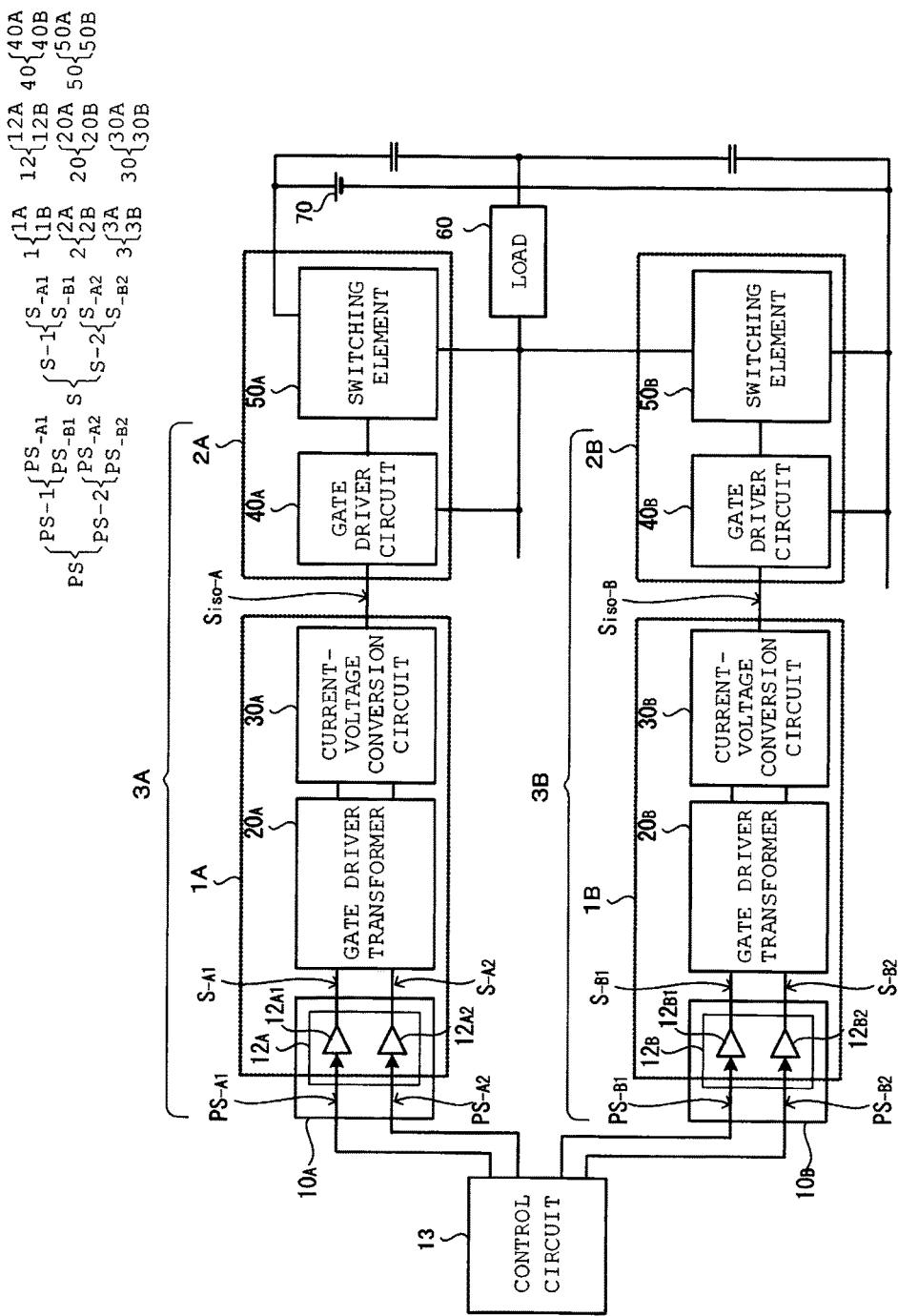

With reference to FIGS. 1A and 1B, a schematic configuration of the high-frequency-isolation gate driver circuit will be described, with reference to FIGS. 2 to 6, one configuration example and an operation example of the high-frequency-isolation gate driver circuit of the present invention will be described, with reference to FIG. 7, another configuration example of the high-frequency-isolation gate driver circuit of the present invention will be described, and with reference to FIGS. 8A through 8C, a configuration example of the gate-driver transformer drive element provided in the high-frequency-isolation gate driver circuit of the present invention will be described.

(Configuration of the Present Invention)

FIGS. 1A and 1B illustrate a schematic configuration of the high-frequency-isolation gate driver circuit of the present invention. FIG. 1A illustrates a configuration for creating pulse signals within the input signal formation circuit, so as to form input signals. FIG. 1B illustrates a configuration where the pulse signals for forming the input signals are introduced from outside the input signal formation circuit. It should be noted that FIGS. 1A and 1B show the configuration example of a half-bridge circuit provided with two switching elements, but the present invention is also applicable to a configuration of a full-bridge circuit that is provided with four switching elements.

In the block diagram as shown in FIG. 1A and FIG. 1B, the switching circuit having the half-bridge configuration comprises a series circuit connecting the switching elements 50A and 50B in series, and a load power source 70 is connected to both ends of the series circuit. The series circuit of the switching elements is connected in parallel with a series circuit where two capacitors are connected in series, and a load 60 is connected between a middle point of the series circuit of the switching elements and a middle point of the series circuit of the capacitors.

The switching elements 50A and 50B are driven respectively by gate driver circuits 40A and 40B. The switching element 50 (50A and 50B), and the gate driver circuit 40 (40A and 40B) may be configured as one circuit configuration in the form of a high-frequency switching module 2 (2A and 2B). In FIGS. 1A and 1B, there is shown an example that a half-bridge constitutes the high-frequency switching module 2, but a full-bridge may be used instead of the half-bridge.

The gate driver circuit 40 (40A and 40B) or the high-frequency switching module 2 (2A and 2B) is connected with the high-frequency-isolation gate driver circuit 1 (1A and 1B).

The high-frequency-isolation gate driver circuit 1 (1A and 1B) inputs isolated drive signal (Siso (Siso-A and Siso-B)) into the gate driver circuit 40 (40A and 40B), so as to perform on/off control on the switching element 50 (50A and 50B). The input signal formation circuit 10, the gate-driver transformer 20, the current-voltage conversion circuit 30, and the gate driver circuit 40 constitute a switching element driving circuit 3 (3A and 3B). On/off control of the switching element 50 (50A and 50B) switches the connecting state between the load power source 70 and the load 60, so as to vary the voltage state that is applied to the load 60. The high-frequency switching module 2A applies high voltage to the load 60, and the high-frequency switching module 2B applies low voltage to the load 60.

The high-frequency-isolation gate driver circuit 1A inputs the isolated drive signal (Siso-A) in the high-side high-frequency switching module 2A, and the high-frequency-isolation gate driver circuit 1B inputs the isolated drive signal (Siso-B) in the low-side high-frequency switching module 2B.

Each of the high-frequency-isolation gate driver circuits 1 (1A and 1B) is provided with gate-driver transformer drive elements 12 (12A and 12B), a gate-driver transformer 20 (20A and 20B), and a current-voltage conversion circuit 30 (30A and 30B).

The gate-driver transformer drive elements 12 (12A and 12B) generate two input signals (S-1 and S-2), on the basis of two pulse signals (PS-1 and PS-2). Thus generated input signals (S-1 and S-2) are applied to the gate-driver transformer 20 (20A and 20B).

The input signals (S) are complementary voltage signals with the same duty ratio but with a relative phase shift, and each potential is switched between high and low alternately in a time sequence, for a complementary potential period when the voltages of both phases have the complementary relation with each other, one having high potential and the other having low potential, and an equipotential period when the voltages of both phases have equal potential.

The input signals (S) are provided with two types of input signal (S-1) and the input signal (S-2) having different potentials, and those signals are inputted respectively in both ends of the primary coil of the gate-driver transformer 20.

The gate-driver transformer 20 (20A and 20B) is an isolation device for providing isolation between the input signal (S) and the isolated drive signal (Siso), and comprises a high-frequency transformer, also referred to as a pulse transformer.

The gate-driver transformer 20 varies the current state in the primary coil in response to the voltage input signals (S-1) and (S-2), thereby delivering secondary side current from the secondary coil, being isolated from the primary side current.

In the gate-driver transformer 20 of the present invention, the input signal (S-1) and the input signal (S-2) respectively enter both ends of the primary coil, and high potential and low potential of the input signals (S-1) and (S-2) are reversed between high and low, thereby inverting the exciting current of the primary coil in every cycle, and eliminating the necessity of resetting of the exciting current. By applying voltages based on the potentials of the input signals (S-1) and (S-2) respectively to both ends of the primary coil, both ends of the primary coil are maintained constantly in a predetermined voltage state, thereby allowing the exciting current of the primary coil to flow all the time, and preventing occurrence of free resonance current.

Pulse signals (PS) may be formed by the pulse signal formation circuit 11, and instead, they may be inputted from an external control circuit 13. FIG. 1A illustrates an example that the pulse signal formation circuit 11 forms pulse signals (PS), and FIG. 1B illustrates an example that pulse signals are inputted from the external control circuit 13. In the configuration example of FIG. 1A, the pulse signal formation circuit and the gate-driver transformer drive element 12 may constitute the input signal formation circuit 10.

The high-side pulse signal formation circuit 11A as shown in FIG. 1A forms two pulse signals, pulse signal PS-A1 and pulse signal PS-A2, and those signals are inputted respectively into the two gate-driver transformer drive elements 12A1 and 12A2. Also on the low side, the low-side pulse signal formation circuit 11B forms two pulse signals, pulse signal PS-B1 and pulse signal PS-B2, and those signals are inputted respectively into the two gate-driver transformer drive elements 12B1 and 12B2.

In the configuration example as shown in FIG. 1B, the control circuit 13 inputs the pulse signals PS-A1 and PS-A2 respectively in the high-side gate-driver transformer drive elements 12A1 and 12A2, and inputs the pulse signals PS-B1 and PS-B2 respectively in the low-side gate-driver transformer drive elements 12B1 and 12B2.

The current-voltage conversion circuit 30 (30A and 30B) converts the current in the secondary coil in the gate-driver transformer 20 (20A and 20B) into voltage, so as to form a voltage signal of the isolated drive signal Siso (Siso-A and Siso-B), and to output the voltage signal to the gate driver circuits 40 (40A and 40B).

Configuration Example and Operation Example of the High-Frequency-Isolation Gate Driver Circuit One configuration example of the high-frequency-isolation gate driver circuit of the present invention and an operation example of the high-frequency-isolation gate driver circuit of the present invention will be described with reference to FIGS. 2 and 3.

Figure 2:
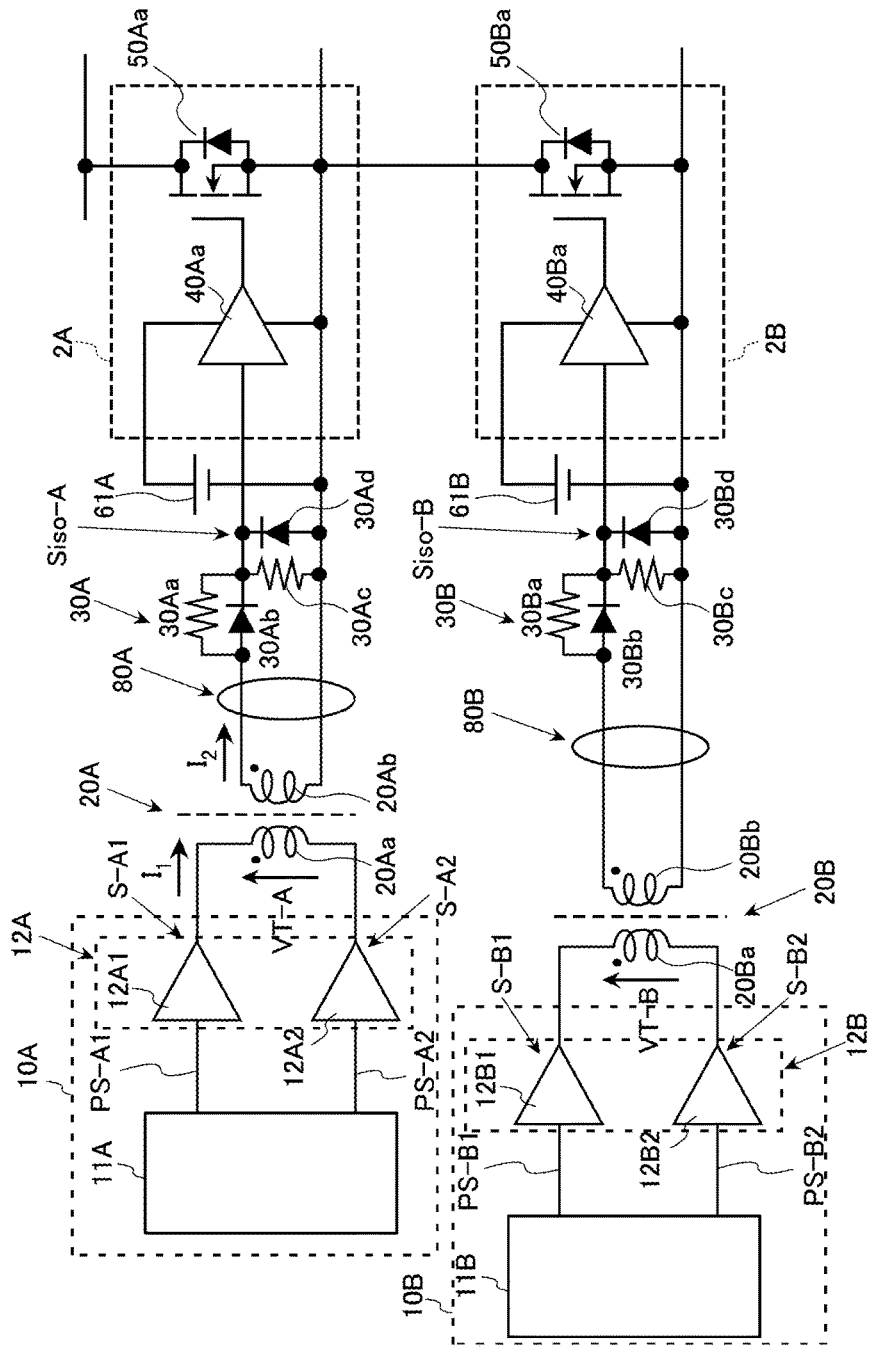
FIG. 2 illustrates one configuration example of the high-frequency-isolation gate driver circuit of the present invention.

FIG. 2 illustrates one configuration example of the high-frequency-isolation gate driver circuit of the present invention, and FIG. 3 illustrates the current and voltage state in the high-frequency-isolation gate driver circuit of the present invention.

The configuration example of FIG. 2 illustrates a half bridge circuit provided with two switching elements, on the high side and on the low side. The high-side configuration for driving the high-side switching element 50Aa is similar to the low-side configuration for driving the low-side switching element 50Ba. Therefore, the configuration of the high-side switching element 50Aa will now be described mainly.

The switching element 50Aa is controlled on and off by the gate driver circuit 40Aa. The switching element 50Aa may comprise an RF-MOSFET, for example, and the gate driver circuit 40Aa may comprise FET and Transistor with a push-pull configuration. The gate driver circuit 40Aa and the switching element 50Aa may be configured as the high-frequency switching module 2A in the foam of one device, or they may be configured as one circuit connecting those devices.

The gate-driver transformer drive element 12A constituting the input signal formation circuit 10A is provided with two drive elements (12A1 and 12A2). Each of the gate-driver transformer drive elements 12A1 and 12A2 may comprise CMOS or TTL devices, having an output stage including two switching elements as shown in FIG. 8A or Drive IC circuits. The switching element may be made up of MOS (FIG. 8B) or Transistor (FIG. 8C). In the two switching elements connected in series, one end of each switching element is connected to the power supply voltage Vcc or ground voltage, or connected to positive power supply voltage Vcc and negative power supply voltage −Vcc, and an input signal S is outputted from the output stage being a connection point where both switching elements are connected.

The pulse signal PS-A1 (FIG. 3(a)) and the pulse signal PS-A2 (FIG. 3(b)) outputted from the pulse signal formation circuit 11 are inputted respectively in the input ends of the gate-driver transformer drive elements 12A1 and 12A2. The pulse signal PS-A1 and the pulse signal PS-A2 are associated with control signals of logic elements "1" and "0", and the gate-driver transformer drive elements 12A1 and 12A2 deliver as the input signals S from the output stage, power supply voltage Vcc, ground voltage, reference voltage or zero voltage; or positive power supply voltage Vcc or negative power supply voltage −Vcc, being selected on the basis of a binary signal of the pulse signal PS.

The pulse signals PS are complementary signals with the same duty ratio but with a relative phase shift, and when logical notation is used, assuming high potential as "1" and low potential as "0", the value "0" and the value "1" are alternately switched in a time sequence, for a complementary period when the value of one phase is "0" and the value of the other phase is "1", and an equipotential period when the values of both phases are identical, "0" or "1", for instance.

The input signal S has a voltage value in association with a value of the pulse signal PS. Therefore, two input signals (S) being formed on the basis of the values of the pulse signals PS, have the same signal waveforms as the pulse signals PS and are complementary voltage signals with the same duty ratio but with a relative phase shift. The input signals are further provided with the complementary potential period and the equipotential period, by switching each potential between high and low, alternately in a time sequence. During the complementary potential period, the signals have the complementary relation where the voltage of one phase has high potential and the voltage of the other phase has low potential, and during the equipotential period, the voltages of both phases have equal potential.

One of the two outputs delivered from the gate-driver transformer drive elements 12A1 and 12A2, is inputted into one end of the primary coil of the gate-driver transformer 20A, as an input signal S-A1 (FIG. 3(g)), and the other output is inputted in the other end of the primary coil of the gate-driver transformer 20A as the input signal S-A2 (FIG. 3(h)).

The output end of the gate-driver transformer drive element 12A1 is connected to one of both ends of the primary coil 20Aa in the gate-driver transformer 20A, and the output end of the gate-driver transformer drive element 12A2 is connected to the other end of the primary coil 20Aa.

When power supply voltage Vcc and ground voltage, or positive power supply voltage Vcc and negative power supply voltage −Vcc, are respectively outputted from the gate-driver transformer drive elements 12A1 and 12A2, voltage between both ends VT-A is applied to both ends of the primary coil 20A, voltage Vcc, −Vcc, or zero; or voltage 2 Vcc, −2 Vcc, or zero, across the primary coil 20Aa (FIG. 3(c)). It should be noted that by setting the positive power supply voltage and the negative power supply voltage to Vcc/2 and −Vcc/2, thereby rendering the voltage between both ends VT-A across the primary coil 20Aa, as Vcc, −Vcc, or zero. By applying such voltage to the primary coil 20Aa, primary current I1 (FIG. 3(d)) passes through the primary coil 20Aa, and secondary current I2 (FIG. 3(e)) passes through the secondary coil 20Ab.

The current-voltage conversion circuit 30A comprises an impedance circuit which connects in series the first parallel circuit of the resistance 30Aa and the rectifier diode 30Ab, and connects in parallel the second parallel circuit of the resistance 30Ac and the rectifier diode 30Ad, with the secondary coil 20Ab. This current-voltage conversion circuit 30A converts the secondary current I2 into positive voltage or negative voltage, according to the current direction of the secondary current I2, and thus obtained voltage in the foam of an isolated drive signal (Siso-A), is inputted in the gate driver circuit 40Aa of the high-frequency switching module 2A.

When the voltage between both ends VT-A across the primary coil 20Aa is positive voltage, the primary current passes from the gate-driver transformer drive element 12A1 toward the gate-driver transformer drive element 12A2, and when the secondary current I2 passes through the secondary coil 20Ab in the direction indicated by the arrow as shown in FIG. 2, the isolated drive signal (Siso-A) of positive voltage is generated by the resistance 30Ac in the second parallel circuit of the current-voltage conversion circuit 30A.

On the other hand, when the voltage between both ends VT-A across the primary coil 20Aa is negative voltage, the primary current passes from the gate-driver transformer drive element 12A2 toward the gate-driver transformer drive element 12A1, and when the secondary current I2 passes through the secondary coil 20Ab in the direction opposite to the arrow as shown in FIG. 2, the isolated drive signal (Siso) of negative voltage (−VF) is generated by the diode 30Ad in the second parallel circuit of the current-voltage conversion circuit 30A.

A high-side configuration has been described so far, and a low-side configuration including the input signal formation circuit 10B, the gate-driver transformer 20B, and voltage-current conversion circuit 30B may be described similarly.
(Exciting Current in Gate-Driver Transformer)

Next, with reference to FIG. 3 to FIGS. 5A through 5F, exciting current in the gate-driver transformer will be described. FIG. 3(d) illustrates primary current I1 of exciting current im and load current iL, and FIGS. 4 and 5 illustrate examples of a flow of the exciting current im. FIG. 4 illustrates an example that voltage Vcc and ground voltage are applied to the primary coil in the gate-driver transformer, and FIGS. 5A through 5F illustrate an example that positive voltage Vcc and negative voltage −Vcc are applied to the primary coil in the gate-driver transformer.

In FIG. 3(d), the solid line indicates the primary current I1 obtained by superimposing the exciting current im on the load current iL, the broken line indicates the exciting current im, and the shaded area indicates the load current iL. In FIG. 3, the reference symbols "A", "B", "C", and "D" indicate, respectively, a period when the pulse signal PS-A1 is "1" and the pulse signal PS-A2 is "0", a period when the pulse signal PS-A1 is "1" and the pulse signal PS-A2 is "1", the period when the pulse signal PS-A1 is "0" and the pulse signals PS-A2 is "1", and the period when the pulse signal PS-A1 is "0" and the pulse signal PS-A2 is "0". In addition, the reference symbols (a) to (d) in FIGS. 4A through 4F and FIGS. 5A through 5F are respectively associated with the periods "A" to "D".

Period "A":

In the period "A", voltage of positive Vcc (2Vcc in FIGS. 5A through 5F) is applied across the primary coil of the gate-driver transformer, thereby allowing the load current iL and exciting current im to pass. The exciting current im flows in the negative direction in the previous period "D", and since the exciting current varies, being delayed with respect to the applied voltage, it flows in the positive direction, rising from −im to +im during this period "A". The load current iL flows when the voltage across the primary coil is positive Vcc.

Figure 4A:
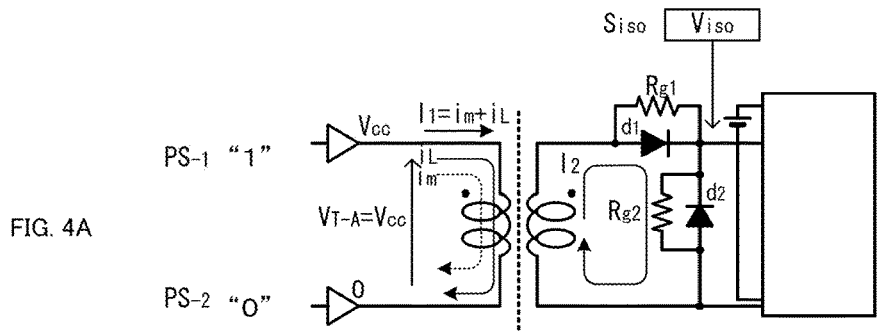
FIGS. 4A through 4F illustrates a flow of exciting current (im) in the high-frequency-isolation gate driver circuit of the present invention.
Figure 5A:
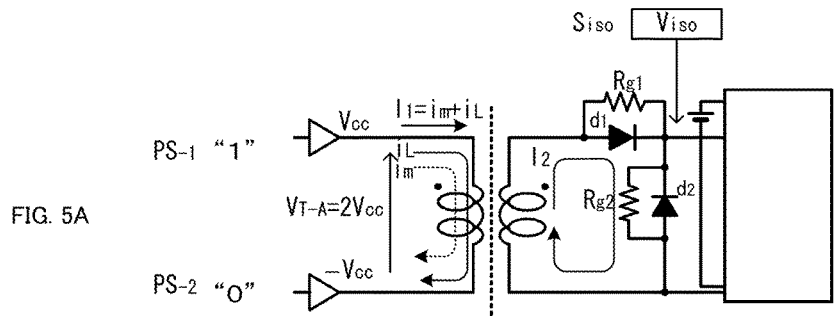
FIGS. 5A through 5F illustrate the flow of the exciting current (im) in the high-frequency-isolation gate driver circuit of the present invention.

In FIG. 4A and FIG. 5A, the solid line indicates the primary current I1 passing through the primary coil, and this current is obtained by combining the load current iL and the exciting current im indicated by the broken line. At this moment, the secondary current I2 passes through the secondary coil in the direction indicated by the arrow, converted into voltage by the resistance Rg2 connected in parallel, and the voltage obtained by the conversion is outputted as an isolated drive signal Siso.

Period "B":

In the period "B", power supply voltage is applied to both terminals of the primary coil in the gate-driver transformer. During this period, there is no difference in voltage between both terminals of the primary coil, and therefore there is no flow of the load current iL. On the other hand, the exciting current im flows in the positive direction in the previous period "A", and there is no difference in voltage between both terminals of the primary coil. Therefore, during this period "B", a constrained magnetization condition arises and the coil is kept magnetized. Accordingly, the exciting current is maintained as the current +im which is equal to the current at the end point of the period "A".

Figure 4B:
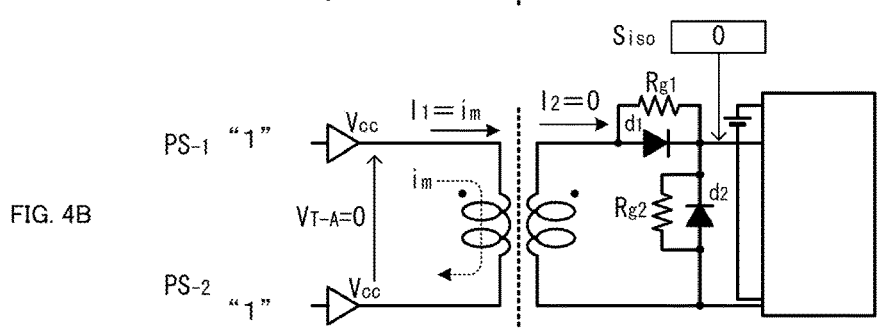
Figure 5B:
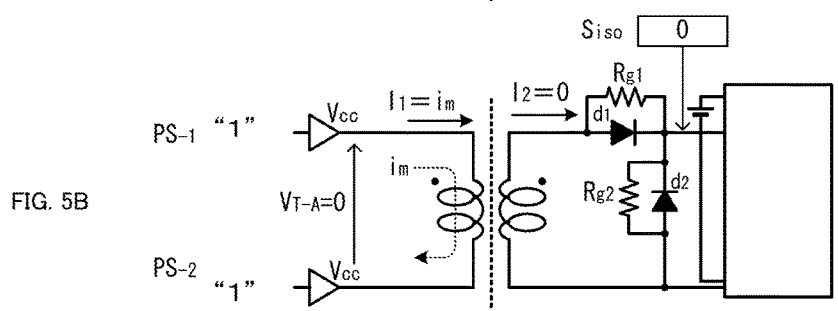

In FIG. 4B and FIG. 5B, only the exciting current im indicated by the broken line corresponds to the primary current I1 of the primary coil. At this moment, the secondary current I2 does not pass through the secondary coil, and an output of the isolated drive signal Siso is zero voltage.

Period "C":

In the period "C", negative voltage −Vcc (−2Vcc in FIGS. 5A through 5F) is applied across the primary coil of the gate-driver transformer, thereby allowing the load current iL and the exciting current im to pass. The exciting current im is maintained in the previous period "B", and in this period "C", the current being decreased from +im in the maintained state, flows in the negative direction. The load current iL flows during the time when the voltage across the primary coil is negative −Vcc (−2Vcc in FIGS. 5A through 5F).

Figure 4C:
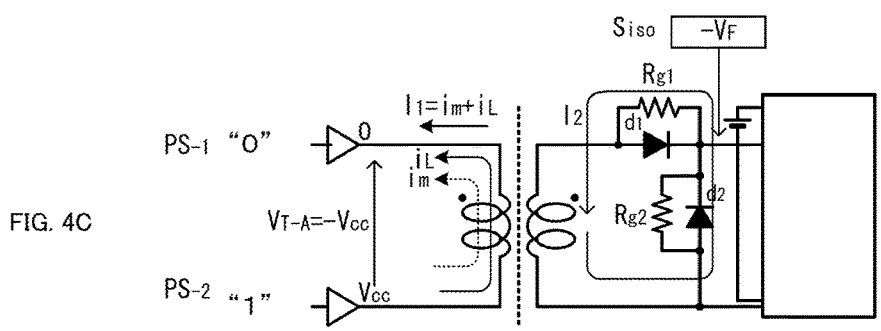
Figure 5C:
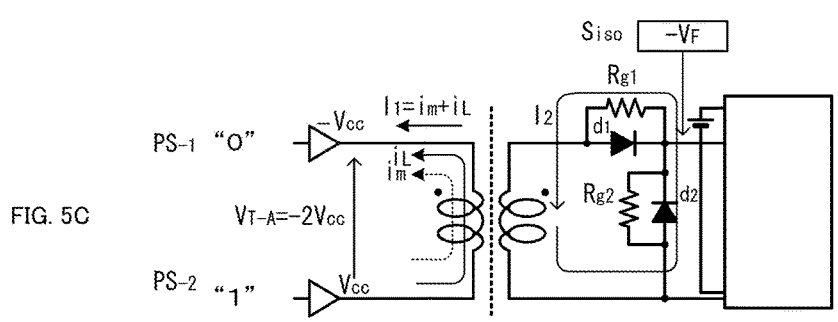

In FIGS. 4C and 5C, the primary current I1 passing through the primary coil is obtained by combining the load current iL indicated by the solid line and the exciting current im indicated by the broken line. At this moment, the secondary current I2 passes through the secondary coil, in the arrow direction opposite to the direction in the period "A", and the secondary current is converted into voltage by the resistance Rg1 connected in series. Then, the isolated drive signal Siso is reversely biased by the forward-direction voltage of the rectifier diode d2 connected in parallel, and −VF corresponding to the reversely biased voltage component is outputted.

Period "D":

In the period "D", ground voltage (negative voltage in FIGS. 5A through 5F) is applied to both ends of the primary coil in the gate-driver transformer. During this period, since there is no difference in voltage between both ends of the primary coil, there is no flow of the load current iL. On the other hand, the exciting current im flows in the negative direction in the previous period "C". Since there is no voltage difference between the ends of the primary coil, a constrained magnetization condition arises during the period "D" where the coil is kept magnetized. Accordingly, the exciting current is maintained as the current −im which is equal to the current at the end point of the period "C".

Figure 4D:
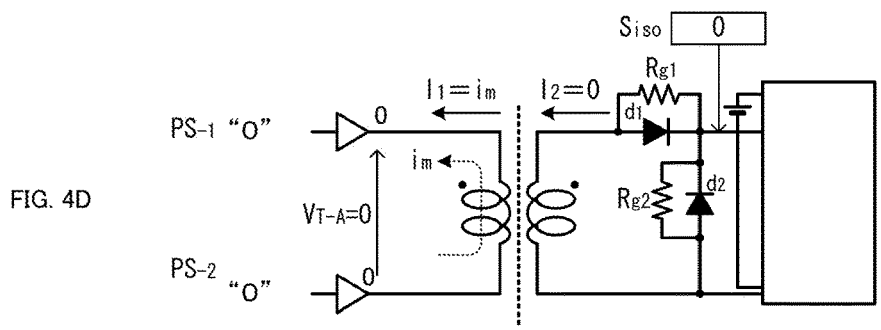
Figure 4E:
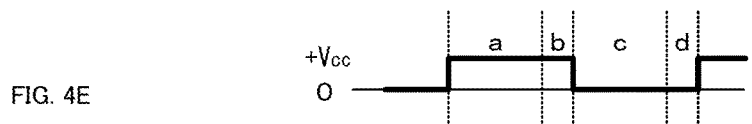
Figure 4F:
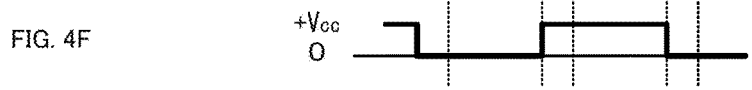
Figure 5D:
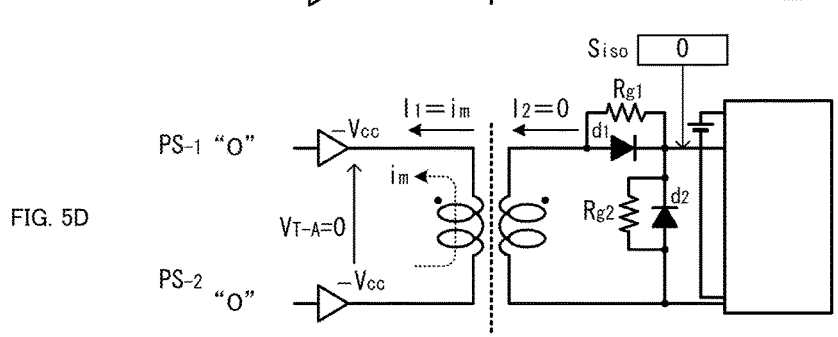
Figure 5E:
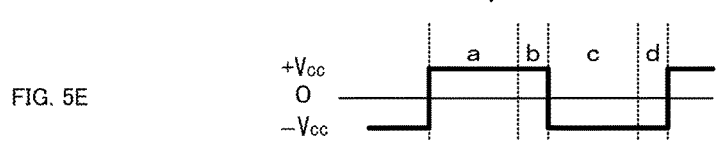
Figure 5F:
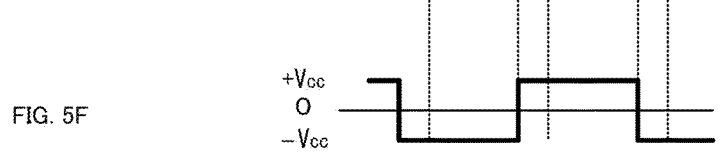

In FIGS. 4D and 5D, only the exciting current im indicated by the broken line corresponds to the primary current I1 in the primary coil. At this moment, the secondary current I2 does not pass through the secondary coil, and the isolated drive signal Siso outputs zero voltage.

Variations of the load current and the exciting current are repeated, assuming the aforementioned periods from "A" to "D" as one cycle, resulting in that the exciting current passes through the primary coil constantly. Accordingly, throughout all the periods, the magnetic flux condition of the coil in the gate-driver transformer is kept as the constrained magnetization condition, which is controlled by the exciting current. Therefore, the gate-driver transformer is constantly driven under a low impedance condition throughout all the periods.

The following table shows the state change during the periods "A" to "D". The table 1 shows an example where the input signals S-1 and S-2 correspond to Vcc and ground voltage, and the table 2 shows an example where the input signals S-1 and S-2 correspond to Vcc and −Vcc.

TABLE 1

|  | A | B | C | D |
| --- | --- | --- | --- | --- |
| Pulse Signal PS-1 | 1 | 1 | 0 | 0 |
| Pulse Signal PS-2 | 0 | 1 | 1 | 0 |
| Input Signal S-1 | Vcc | Vcc | Ground Voltage | Ground Voltage |
| Input Signal S-2 | Ground Voltage | Vcc | Vcc | Ground Voltage |
| Voltage across Primary Coil VT | Vcc | 0 | −Vcc | 0 |
| Primary Coil Current I 1 | Exciting Current −I m→ I m Load Current I L | Exciting Current I m | Exciting Current I m→−I m Load Current −I L | Exciting Current −I m |
| Secondary Coil Current I 2 | I 2 | 0 | −I 2 | 0 |
| Isolated Drive Signal S iso | S iso | 0 | −S iso | 0 |

TABLE 2

|  | A | B | C | D |
|---|---|---|---|---|
| Pulse Signal PS-1 | 1 | 1 | 0 | 0 |
| Pulse Signal PS-2 | 0 | 1 | 1 | 0 |
| Input Signal S-1 | Vcc | Vcc | −Vcc | −Vcc |
| Input Signal S-2 | −Vcc | Vcc | Vcc | −Vcc |
| Voltage across Primary Coil VT | 2 Vcc | 0 | −2 Vcc | 0 |
| Primary Coil Current I 1 | Exciting Current −I m→ I m Load Current I L | Exciting Current I m | Exciting Current I m→−I m Load Current −I L | Exciting Current −I m |
| Secondary Coil Current I 2 | I 2 | 0 | −I 2 | 0 |
| Isolated Drive Signal S iso | S iso | 0 | −S iso | 0 |

(Functions of the High-Frequency-Isolation Gate Driver Circuit)

Figure 6:
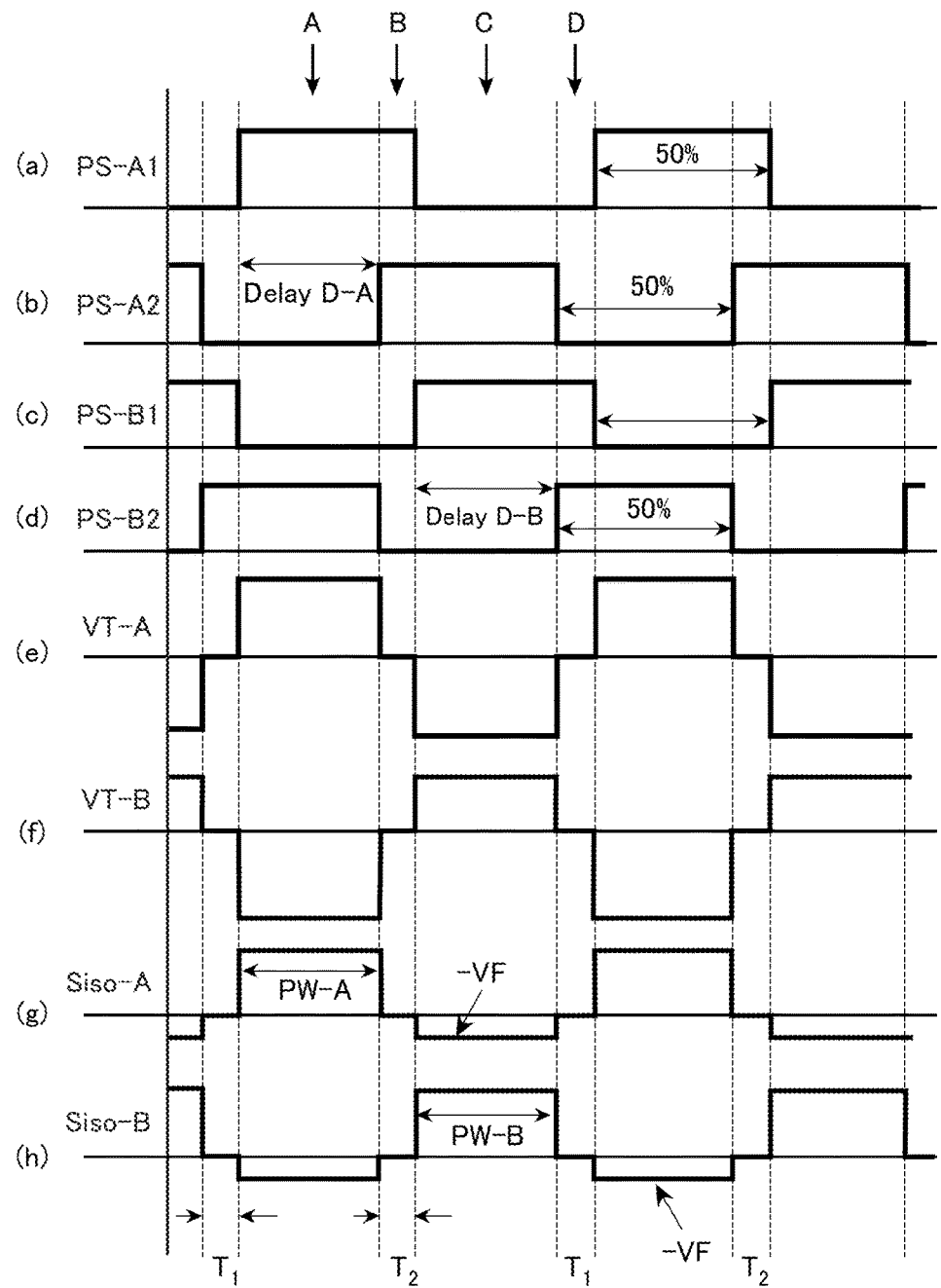
FIG. 6 illustrates a reverse bias effect of the current-voltage conversion circuit, and a pulse width modulation of the isolated drive signal.
Figure 7:
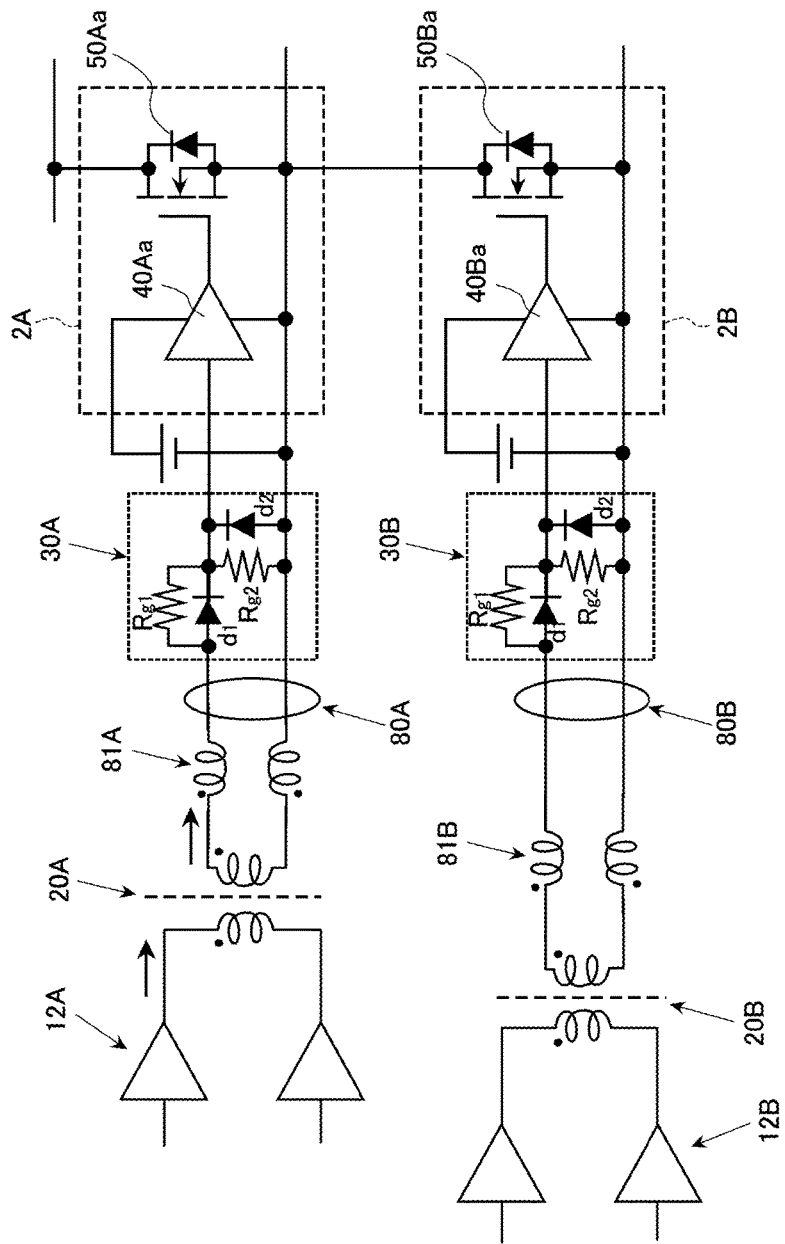
FIG. 7 illustrates another configuration example of the high-frequency-isolation gate driver circuit of the present invention.
Figure 10A:
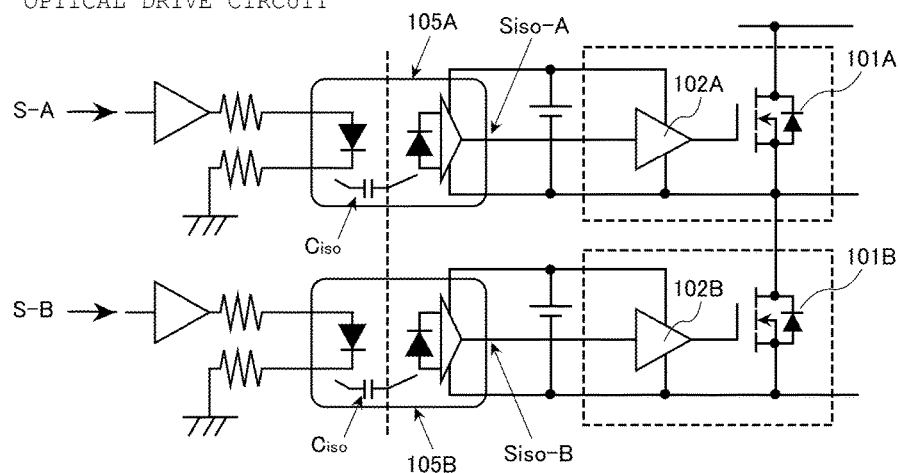
FIGS. 10A and 10B illustrate a circuit example using photo couplers.
Figure 10B:
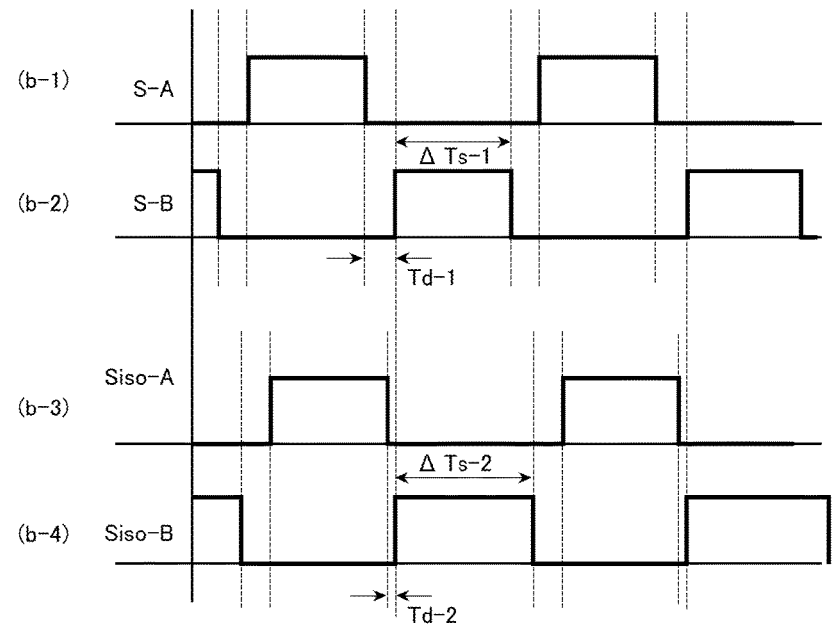

With reference to FIGS. 6 and 7, operations of the high-frequency-isolation gate driver circuit will now be described. The high-frequency-isolation gate driver circuit of the present invention operates to bring about the followings; a reverse bias effect by the current-voltage conversion circuit, a pulse width modulation of an isolated drive signal using a signal delay (phase difference) between two input signals (S), prevention of short-circuiting between the switching elements, and impedance matching.

FIG. 6(a) and FIG. 6(b) illustrate respectively, the pulse signal PS-A1 and the pulse signal PS-A2 on the high side.

The pulse signals PS-A1 and PS-A2 are complementary signals with the same duty ratio but with a relative phase shift, and when logical notation is used, assuming high potential as "1" and low potential as "0", the value "0" and the value "1" are alternately switched in a time sequence, for a complementary period when the value of one signal is "0" and the value of the other signal is "1", and an equipotential period when the value of both the signals are identical, "0" or "1". In this example here, the duty ratio is 50%, but the duty ratio is not limited to 50%.

There is a phase difference between the pulse signal PS-A1 and the pulse signal PS-A2, and the pulse signal PS-A2 has a phase difference of delay D-A due to a signal delay relative to the pulse signal PS-A1. With this phase difference, the pulse signal PS-A1 and the pulse signal PS-A2 are provided with the complementary period when one signal is "0" and the other signal is "1", and the equivalence period when both signals are "0" or "1".

With the phase difference between the pulse signal PS-A1 and the pulse signal PS-A2, the voltage VT-A of the primary coil in the high-side gate-driver transformer becomes a waveform as shown in FIG. 6(e), and the high-side isolated drive signal Siso-A has a waveform as shown in FIG. 6(g).

FIGS. 6(c) and 6(d) illustrate the pulse signal PS-B1 and the pulse signal PS-B2 on the low side, respectively.

There is a relation between the pulse signal PS-B1 and the pulse signal PS-B2, similar to the relation between the pulse signal PS-A1 and the pulse signal PS-A2, and the pulse signal PS-B2 has a phase difference of delay D-B due to a signal delay, relative to the pulse signal PS-B1. With this phase difference, the voltage VT-B of the primary coil in the low-side gate-driver transformer becomes the waveform as shown in FIG. 6(f), and the low-side isolated drive signal Siso-B has the waveform as shown in FIG. 6(h).

Reverse Bias Effect of the Current-Voltage Conversion Circuit:

The high-side isolated drive signal Siso-A as shown in FIG. 6(g) is reversely biased by the forward-direction voltage of the rectifier diode in the current-voltage conversion circuit during the period C, and becomes negative voltage −VF. On the other hand, the low-side isolated drive signal Siso-B as shown in FIG. 6(h) is reversely biased by the forward-direction voltage during the period A by the rectifier diode in the current-voltage conversion circuit and becomes negative voltage −VF.

Voltage of the high-side isolated drive signal Siso-A and voltage of the low-side isolated drive signal Siso-B are biased in the negative direction toward the negative voltage −VF, herewith a signal level for driving the gate driver circuit 40 is biased to the negative direction. By biasing the signal level to the negative direction, a noise component is superimposed on the isolated drive signal Siso-A and on the isolated drive signal Siso-B, and even when the signal level for driving the gate driver circuit 40 fluctuates, it is possible to prevent a rise of voltage to the level that turns on the gate driver circuit 40, and thus preventing a malfunction of the gate driver circuit 40.

Pulse Width Modulation of Isolated Drive Signal:

FIG. 6(g) illustrates the high-side isolated drive signal (Siso-A), and FIG. 6(h) illustrates the low-side isolated drive signal (Siso-B).

A pulse width PW-A of the high-side isolated drive signal (Siso-A) corresponds to the phase difference due to the delay component delay D-A between the pulse signal PS-A1 (FIG. 6(a)) and the pulse signal PS-A2 (FIG. 6(b)) on the high side. Therefore, by varying the width (delay D-A) of the phase difference between the pulse signal PS-A1 and the pulse signal PS-A2 on the high side, the pulse width PW-A can be modulated.

The width (delay D-A) of the phase difference between the pulse signal PS-A1 and the pulse signal PS-A2 on the high side, is a parameter independent of the duty ratio between the pulse signal PS-A1 and the pulse signal PS-A2, and the duty ratio between the pulse signal PS-B1 and the pulse signal PS-B2 on the low side. Therefore, this pulse width PW-A can be modulated without changing the duty ratio between the pulse signals from PS-A1 to PS-B2.

The pulse width PW-B of the low-side isolated drive signal (Siso-B) corresponds to the phase difference due to the delay component delay D-B between the pulse signal PS-B1 (FIG. 6(c)) and the pulse signal PS-B2 (FIG. 6(d)) on the low side, and by varying the phase difference width (delay D-B) between the pulse signal PS-B1 and the pulse signal PS-B2 on the low side, the pulse width PW-B can be modulated.

The width (delay D-B) of the phase difference between the pulse signal PS-B1 and the pulse signal PS-B2 on the low side, is a parameter independent of the duty ratio between the pulse signal PS-B1 and the pulse signals PS-B2 on the low side, and the duty ratio between the pulse signal PS-A1 and the pulse signal PS-A2 on the high side. Therefore, the pulse width PW-B can be modulated without changing the duty ratio between the pulse signals from PS-A1 to PS-B2.

Prevention of Short-Circuiting Between Switching Elements:

In the figures from FIG. 6(a) to FIG. 6(d), by setting time intervals between a fall of the pulse signal PS-A2 and a rise of the pulse signal PS-A1, and between a rise of the pulse signal PS-B2 and a fall of the pulse signal PS-B1, a dead time T1 is provided between the high-side isolated drive signal (Siso-A) (FIG. 6(g)) and the low-side isolated drive signal (Siso-B) (FIG. 6(h)). During this dead time T1 period, both the high-side isolated drive signal (Siso-A) and the low-side isolated drive signal (Siso-B) are under a low level condition, and thus any of the high-side switching element and the low-side switching element become non-conductive.

The period of the dead time T1 is associated with the timing of switching from the conductive state of the low-side switching element to the conductive state of the high-side switching element, and by rendering both the switching elements as non-conductive, it is possible to prevent short-circuiting between those switching elements.

By setting time intervals between a rise of the pulse signal PS-A2 and a fall of the pulse signal PS-A1, and between a fall of the pulse signal PS-B2 and a rise of the pulse signal PS-B1, a dead time T2 is provided between the high-side isolated drive signal (Siso-A) (FIG. 6(g)) and the low-side isolated drive signal (Siso-B) (FIG. 6(h)). During this dead time T2 period, both the high-side isolated drive signal (Siso-A) and the low-side isolated drive signal (Siso-B) are under a low level condition, any of the high-side switching element and the low-side switching element become non-conductive.

The period of the dead time T2 is associated with the timing of switching from the conductive state of the high-side switching element to the conductive state of the low-side switching element, and by rendering the both switching elements as non-conductive, it is possible to prevent short-circuiting between those switching elements.

Each of those dead time periods corresponds to an interval when the exciting current is maintained and continues to flow without stop.

Impedance Matching:

FIG. 7 illustrates an impedance matching in the high-frequency-isolation gate driver circuit of the present invention.

As an aspect of the impedance matching, it is performed by regulating resistance in the current-voltage conversion circuit, and as another aspect of the impedance matching, it is performed by a common mode transformer.

As shown in FIG. 2, the current-voltage conversion circuits 30A, 30B are provided with the first parallel circuit connected in series and the second parallel circuit connected in parallel. By setting a resistance value Rg1 of the resistance in the first parallel circuit to be equal to a resistance value Rg2 of the resistance in the second parallel circuit, it is possible to keep the impedance constant all the time, when viewed from the gate-driver transformer.

By selecting characteristic impedance Rline of the transmission line 80, the resistance value Rg1 of the resistance in the first parallel circuit, and the resistance value Rg2 of the resistance in the second parallel circuit in such a manner that those three values are identical to one another, the input signal (S) entering the primary side of the gate-driver transformer can be transmitted without distortion as isolated drive signal (Siso).

In FIG. 7, the common mode transformers 81A, 81B are installed on two transmission lines 80 respectively connected to both ends of the secondary coil of the gate-driver transformer in the high-frequency-isolation gate driver circuit. The common mode transformers 81A, 81B have a wire with the same winding direction as the direction of the two transmission lines 80. It functions as an inductor for common mode current, and does not function as an inductor for differential mode current, thereby acting as a noise filter against common mode noise current. Accordingly, it is possible to reduce influence of the displacement voltage passing from the primary side to the secondary side, via the parasitic capacitance between the primary side and the secondary side of the gate-driver transformer.

The common mode transformers 81A, 81B may have any of the following configurations, such as a configuration provided on the secondary side of the gate-driver transformer as the example of FIG. 7, a configuration provided on the primary side of the gate-driver transformer, and a configuration provided both on the primary side and the secondary side of the gate-driver transformer.

With reference to FIGS. 8A through 8C, there will be described a configuration example of the gate-driver transformer drive element provided in the high-frequency-isolation gate driver circuit of the present invention.

As shown in FIGS. 8A, 8B, and 8C, the gate-driver transformer drive element may be configured by CMOS, TTL, or DriveIC, comprising two switching elements such as MOS-FETs and Transistors, being connected in series. In the case where a large current passes through the gate-driver transformer, it may be configured by connecting plural drive gate-driver transformer drive elements in parallel. As the switching element, J-FET (junction FET) may be employed instead of MOS-FET.

FIGS. 8B and 8C illustrate a configuration connecting gate-driver transformer drive elements in parallel, FIG. 8B illustrates a configuration using MOS-FETs as the gate-driver transformer drive element, and FIG. 8C illustrates a circuit configuration example using Transistors as the switching elements.

The embodiments and modifications as described above are just examples of the high-frequency-isolation gate driver circuit and the gate circuit driving method, relating to the present invention. The present invention is not limited to each of those embodiments and it should be understood that disclosed embodiments are susceptible of changes and modifications without departing from the scope of the invention. Accordingly, all such modifications are intended to be included within the scope of the invention.

FIGS. 8(b) and 8(c) illustrate a configuration connecting gate-driver transformer drive elements in parallel, FIG. 8(b) illustrates a configuration using MOS-FETs as the gate-driver transformer drive element, and FIG. 8(c) illustrates a circuit configuration example using Transistors as the switching elements.

The embodiments and modifications as described above are just examples of the DC power supply and a method for controlling the DC power supply, relating to the present invention. The present invention is not limited to each of those embodiments and it should be understood that disclosed embodiments are susceptible of changes and modifications without departing from the scope of the invention. Accordingly, all such modifications are intended to be included within the scope of the invention.

INDUSTRIAL APPLICABILITY

The high-frequency-isolation gate driver circuit and the gate circuit driving method of the present invention are applicable to a power converter such as an inverter.

DESCRIPTION OF SYMBOLS 1, 1A, 1B high-frequency-isolation gate driver circuit
2, 2A, 2B high-frequency switching module
3, 3A, 3B switching element drive circuit
10, 10A, 10B input signal formation circuit
11, 11A, 11B pulse signal formation circuit
gate-driver transformer drive element
12A, 12B gate-driver transformer drive element
12A1, 12A2, 12B1, 12B2 gate-driver transformer drive element
13 control circuit
20, 20A, 20B gate driver transformer
20Aa primary coil
20Ab secondary coil
30, 30A, 30B current-voltage conversion circuit
30Aa resistance
30Ab rectifier diode
30Ac resistance
30Ad rectifier diode
40, 40A, 40B, 40Aa, 40Ba gate driver circuit
50, 50A, 50B, 50Aa, 50Ba switching element
60 load
70 load power source
transmission line
81A, 81B common mode transformer
101, 101A, 101B, 101C, 101D switching element
102, 102A, 102B, 102C, 102D gate driver circuit
103 driving source
104 load
105 isolation device
105A, 105B photo coupler
106, 106A, 106B free-magnetization transformer circuit
106a transformer
106b FET
106c reset circuit
106d rectifier circuit
Ciso parasitic capacitance
I1 primary current
I2 secondary current
iL load current
im exciting current
PS pulse signal
PS-A1, PS-A2, PS-B1, PS-B2 pulse signal
PW-A, PW-B pulse width
Rg1 resistance
Rg2 resistance
Rline characteristic impedance
S, S-A, S-B, S-A1, S-A2, S-B1, S-B2 input signal
Siso, Siso-A, Siso-B isolated drive signal
T1, T2 dead time
Vcc power supply voltage
Vds voltage across terminals
VT-A, VT-B, voltage across terminals

What is claimed is:

1. A high-frequency-isolation gate driver circuit for driving plural gate circuits, the plural gate circuits being driven by RF signals mutually isolated, comprising:
    an input signal formation circuit configured to output two input signals being complementary voltage signals with the same duty ratio but with a relative phase shift, provided with a complementary potential period when voltages of both phases have a complementary relation with each other, one having a high potential and the other having a low potential, and an equipotential period when the voltages of both phases have equal potential in each of the high potential and the low potential, switching the potential of the two input signals between the high potential and the low potential alternately in a time sequence,
    a gate-driver transformer configured to connect output terminals of the input signal formation circuit respectively for both phases, with input terminals on both ends of a primary coil of the gate-driver transformer, and
    a current-voltage conversion circuit having input terminals connected to the output terminals of the gate-driver transformer, so as to provide current to voltage conversion to secondary current passing through the gate-driver transformer, and to output an isolated drive signal obtained by the current to voltage conversion to one of the plural gate circuits, wherein,
    the input signal formation circuit makes to pass load current and exciting current during the complementary potential period and the exciting current during the equipotential period to the primary coil of the gate-driver transformer, and
    the current-voltage conversion circuit converts the secondary current to positive voltage and negative voltage during the complementary potential period, and inputs the isolated drive signal of positive voltage and negative voltage alternatively to the one of the plural gate circuits.

2. The high-frequency-isolation gate driver circuit according to claim 1, wherein,
    the current-voltage conversion circuit comprises a series connection of a first parallel circuit and a second parallel circuit, each including a resistor and a rectifier diode connected in parallel,
    the first parallel circuit is connected in series with the secondary coil of the gate-driver transformer at a winding start, in such a manner that a forward direction of the rectifier diode of the first parallel circuit is oriented to the one of the plural gate circuits, and
    the second parallel circuit is connected in parallel with the secondary coil of the gate-driver transformer, between the winding start and a winding end, in such a manner that the forward direction of the rectifier diode of the second parallel circuit is oriented to an input end of the one of the plural gate circuits.

3. The high-frequency-isolation gate driver circuit according to claim 2, wherein,
    a resistance value of the resistor in the first parallel circuit and a resistance value of the resistor in the second parallel circuit adjust input impedance to a predetermined value, viewed from the gate-driver transformer.

4. The high-frequency-isolation gate driver circuit according to claim 3, wherein,
    the resistance value of the resistor in the first parallel circuit and the resistance value of the resistor in the second parallel circuit are identical.

5. The high-frequency-isolation gate driver circuit according to claim 3, wherein,
    the resistance value of the resistor in the first parallel circuit and the resistance value of the resistor in the second parallel circuit correspond to a characteristic impedance of a transmission path between the gate-driver transformer and the current-voltage conversion circuit.

6. The high-frequency-isolation gate driver circuit according to claim 1, wherein,
a primary side or a secondary side of the gate-driver transformer comprises a common mode transformer, and the common mode transformer has a same characteristic impedance as a characteristic impedance of a transmission path between the gate-driver transformer and the current-voltage conversion circuit.

7. The high-frequency-isolation gate driver circuit according to claim 1, wherein,
the input signal formation circuit comprises:
a pulse signal formation circuit configured to form RF pulse signals, and
two gate-driver transformer drive elements configured to deliver the two input signals each having the high potential or the low potential, based on the RF pulse signals being binary.

8. The high-frequency-isolation gate driver circuit according to claim 1, further comprising a control circuit configured to form RF pulse signals, wherein,
the input signal formation circuit comprises:
two gate-driver transformer drive elements configured to deliver the two input signals each having the high potential or the low potential, based on the RF pulse signals being binary that are formed by the control circuit.

9. The high-frequency-isolation gate driver circuit according to claim 1, wherein,
the one of the plural gate circuits comprises a high-frequency switching module including a switching element and a gate driver circuit for driving the switching element, and
the gate driver circuit performs on/off control of the switching element, according to the isolated drive signal outputted from the current-voltage conversion circuit.

10. The high-frequency-isolation gate driver circuit according to claim 1, wherein,
the plural gate circuits are made up of a full bridge or a half bridge of a high-side gate circuit for applying the high potential to a load and a low-side gate circuit for applying the low potential to the load, and
the high-frequency-isolation gate driver circuit is connected to each of input ends of the high-side gate circuit and the low-side gate circuit.

11. The high-frequency-isolation gate driver circuit according to claim 7, wherein,
one of the two gate-driver transformer drive elements on its high side forms one of the two input signals with a high-potential or low-potential, on the basis of power supply voltage, and
one of the two gate-driver transformer drive elements on its low side forms one of the two input signals with a high-potential or low-potential, on the basis of ground voltage or reference voltage including zero voltage.

12. The high-frequency-isolation gate driver circuit according to claim 7, wherein,
one of the two the gate-driver transformer drive elements on its high side forms one of the two input signals with a high-potential or low-potential on the basis of positive power supply voltage, and one of the two the gate-driver transformer drive elements on its low side forms one of the two input signals with a high-potential or low-potential on the basis of negative power supply voltage.

13. A gate circuit driving method for driving plural gate circuits, the plural gate circuits being driven by mutually isolated plural RF signals, comprising:
applying two input signals respectively to both ends of a primary coil of a gate-driver transformer, the two input signals being complementary voltage signals with the same duty ratio but with a relative phase shift, provided with a complementary potential period when voltages of both phases have a complementary relation with each other, one having a high potential and the other having a low potential, and an equipotential period when the voltages of both phases have equal potential in each of the high potential and the low potential, the potential of each of the two input signals being switched between the high potential and the low potential alternately in a time sequence, and
allowing exciting current and load current to pass during the complementary potential period, and allowing the exciting current to pass during the equipotential period, through the primary coil of the gate-driver transformer,
converting secondary current passing through a secondary coil of the gate-driver transformer to positive voltage and negative voltage during the complementary potential period, inputting an isolated drive signal of positive voltage and negative voltage alternatively to one of the plural gate circuits, and
driving the one of the plural gate circuits by the isolated drive signal.

14. The gate circuit driving method, according to claim 13, comprising:
establishing a series connection of a first parallel circuit a second parallel circuit, each including a resistor and a rectifier diode connected in parallel, wherein,
establishing the first parallel circuit being a parallel-connection circuit of the resistor and the rectifier diode in the first parallel circuit, connected in series with the secondary coil of the gate-driver transformer at a winding start, in such a manner that a forward direction of the rectifier diode in the first parallel circuit is oriented to the one of the plural gate circuits, and the second parallel circuit being a parallel-connection circuit of the resistor and the rectifier diode in the second parallel circuit, connected in parallel with the secondary coil of the gate-driver transformer, between the winding start and a winding end, in such a manner that a forward direction of the rectifier diode in the second parallel circuit is oriented to an input end of the one of the plural gate circuits,
performing current-voltage conversion by a current-voltage conversion circuit being connected to the secondary coil of the gate-driver transformer, and
biasing a potential of the isolated drive signal in a reverse direction by the rectifier diode in the second parallel circuit during a period when difference voltage of the two input signals is negative with respect to the forward direction of the rectifier diode in the first parallel circuit.

15. The gate circuit driving method, according to claim 13, wherein,
two gate-driver transformer drive elements are provided,
a high-potential signal of the two input signals being a binary RF pulse signal is applied to one of the gate-driver transformer drive elements, so as to create a high-potential of the two input signals, and a low-potential signal of the two input signals being a binary RF pulse signal is applied to the other gate-driver transformer drive element, so as to create a low-potential of the two input signals.

16. The gate circuit driving method, according to claim 13, wherein, a gate driver circuit provided in the one of the plural gate circuits generates drive voltage, from the isolated drive signal that is outputted from a current-voltage conversion circuit, and on/off control of a switching element provided in the one of the plural gate circuits is performed according to the drive voltage.

17. The gate circuit driving method, according to claim 13, wherein, a duty ratio of the isolated drive signal is adjusted by a phase difference between the two input signals.

* * * * *